United States Patent
Chen et al.

(10) Patent No.: US 10,667,215 B2
(45) Date of Patent: May 26, 2020

(54) WIRELESS RECEIVING DEVICE, WAKE-UP RECEIVER AND METHOD FOR CALIBRATING A FREQUENCY AND A BANDWIDTH

(71) Applicant: Industrial Technology Research Institute, Hsinchu (TW)

(72) Inventors: Wei-Zen Chen, Hsinchu County (TW); Shih-Hsuan Hung, Tainan (TW); Kuan-Hsiu Chien, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 211 days.

(21) Appl. No.: 15/856,004

(22) Filed: Dec. 27, 2017

(65) Prior Publication Data

US 2019/0166557 A1 May 30, 2019

(30) Foreign Application Priority Data

Nov. 28, 2017 (TW) .............................. 106141345 A

(51) Int. Cl.
*H04W 52/02* (2009.01)
*H03L 7/095* (2006.01)
(Continued)

(52) U.S. Cl.
CPC ........ *H04W 52/0229* (2013.01); *H03F 3/183* (2013.01); *H03F 3/45179* (2013.01);
(Continued)

(58) Field of Classification Search
CPC .............. H04W 52/0229; H04W 52/02; H03F 3/45475; H03F 3/183; H03F 3/45179;
(Continued)

(56) References Cited

U.S. PATENT DOCUMENTS 6,226,506 B1 * 5/2001 Welland .................. H03L 7/087
331/36 C
6,492,944 B1 12/2002 Stilp
(Continued)

FOREIGN PATENT DOCUMENTS

CN 103176197 A 6/2013
CN 103176197 B 11/2014
(Continued)

OTHER PUBLICATIONS

Demirkol et al. "Wake-up receivers for wireless sensor networks: Benefits and challenges," IEEE Wireless Communications, Aug. 2009, pp. 88-96, vol. 16, No. 4, IEEE, US.
(Continued)

*Primary Examiner* — Ricardo H Castaneyra

(57) ABSTRACT

A wireless receiving device includes a wake-up receiver, a main receiver and a calibration circuit. The wake-up receiver operates in a monitoring mode or a sleep mode. When operating in the monitoring mode, the wake-up receiver monitors whether a request signal is transmitted by a communication device and issues a wake-up signal after receiving the request signal. The main receiver operates in a sleep mode or a transmission mode. When operating in the sleep mode, the main receiver is woken up and enters the transmission mode to transmit and receive data to and from the communication device when receiving the wake-up signal. The calibration circuit is coupled to the wake-up receiver and the main receiver and configured to receive a calibration signal from the main receiver and calibrate a reception frequency of the wake-up receiver in the background in response to the calibration signal.

13 Claims, 18 Drawing Sheets

(51) Int. Cl.
  *H03F 3/45* (2006.01)
  *H04B 17/21* (2015.01)
  *H03L 7/089* (2006.01)
  *H03F 3/183* (2006.01)
  *H04B 17/14* (2015.01)

(52) U.S. Cl.
  CPC ....... *H03F 3/45475* (2013.01); *H03L 7/0891* (2013.01); *H03L 7/095* (2013.01); *H04B 17/14* (2015.01); *H04B 17/21* (2015.01); *H03F 2200/06* (2013.01); *H03F 2200/102* (2013.01); *H03F 2200/465* (2013.01)

(58) Field of Classification Search
  CPC ........... H03F 2200/465; H03F 2200/06; H03F 2200/102; H04B 17/14; H04B 17/21; H03L 7/0891; H03L 7/095; H03L 7/099; H03L 5/00
  See application file for complete search history.

(56) References Cited

U.S. PATENT DOCUMENTS

| | | | |
|---|---|---|---|
| 9,413,403 | B2 | 8/2016 | Wentzloff et al. |
| 9,531,484 | B2 | 12/2016 | Klm et al. |
| 2006/0111071 | A1 | 5/2006 | Paulus et al. |
| 2007/0213028 | A1 | 9/2007 | Shohara et al. |
| 2014/0050133 | A1 | 2/2014 | Jafarian et al. |
| 2014/0171001 | A1 | 6/2014 | Fernando et al. |
| 2015/0207530 | A1 | 7/2015 | Kim et al. |

FOREIGN PATENT DOCUMENTS

| | | |
|---|---|---|
| TW | 201127112 | 9/2011 |
| TW | 201206126 | 2/2012 |

OTHER PUBLICATIONS

Lin et al., "Power-efficient rendez-vous schemes for dense wireless sensor networks," IEEE International Conference on Communications, dated Jun. 2004, pp. 3769-3776, IEEE, US.

Hambeck et al., "A 2.4μW Wake-up Receiver for wireless sensor nodes with -71dBm sensitivity," IEEE Int. Symp. on Circuits and Systems, May 2011, pp. 534-537, IEEE, US.

Pletcher et al. "A 52 μW Wake-Up Receiver With -72 dBm Sensitivity Using an Uncertain-IF Architecture," IEEE Journal of Solid-State Circuits, Jan. 2009, pp. 269-280, vol. 44, No. 1, IEEE, US.

Chen et al , "A 4.5 μW 2.4 GHz wake-up receiver based on complementary current-reuse RF detector," in Proc. IEEE Int. Symp. on Circuits and Systems, May 2015, pp. 1214-1217, IEEE, US.

Wu et al. "17 GHz RF Front-Ends for Low-Power Wireless Sensor Networks", IEEE Journal of solid-state circuits, Sep. 2008, pp. 1909-1919. vol. 43, No. 9, IEEE, US.

Chen, et al , "A 433 MHz 54 μW OOK/FSK/PSK Compatible Wake-Up Receiver with 11 μW Low-Power Mode Based on Injection-Locked Oscillator," European Solid-State Circuits Conference, ESSCIRC Conference 2016: 42nd, Sep. 2016, pp. 137-140, IEEE, US.

* cited by examiner

WIRELESS RECEIVING DEVICE, WAKE-UP RECEIVER AND METHOD FOR CALIBRATING A FREQUENCY AND A BANDWIDTH

CROSS REFERENCE TO RELATED APPLICATIONS

This Application claims priority of Taiwan Patent Application No. 106141345, filed on Nov. 28, 2017, the entirety of which is incorporated by reference herein.

TECHNICAL FILED

The invention relates to a circuit design of a wireless receiver capable of calibrating its reception frequency and reception bandwidth.

BACKGROUND

Power consumption is a major problem in today's wireless systems. Although the performance of wireless systems is constantly improving due to increasing demand for higher data rates and additional functionality, power dissipation remains a concern as the housing of wireless communication devices get smaller. Enhancing the battery life of these wireless communication devices is also a challenge because as the performance of wireless systems improves, there is generally a higher burden on battery usage. There also exists a big power-saving requirement for wireless transmission node applications. The wireless communication device in a wireless transmission node can generally be separated into two parts, including a wake-up receiver and a main receiver. In order to reduce power consumption, the main receiver usually operates in a sleep mode and the wake-up receiver operates in a monitoring mode. When the wake-up receiver receives a request signal in the wireless communication environment, it wakes up the main receiver for data transmission. Since the wake-up receiver does not need to perform complex data transmission, the process of long-time monitoring does not consume too much power. The use of the wake-up receiver for monitoring can effectively reduce power consumption, in comparison to the use of the whole wireless receiving device of the wireless communication device for monitoring the request signal.

The wake-up receiver usually needs very high sensitivity, so as to avoid the loss of the request signal in the wireless communication environment. In addition, the wake-up receiver should have a sufficiently large bandwidth for tolerating the reception frequency shift due to variations in environmental temperatures and voltages. However, the sensitivity is negatively correlated with the bandwidth. That is, once the bandwidth is increased, the sensitivity will be reduced. In addition, the operation frequency (reception frequency) of the conventional wake-up receiver cannot be adjusted after the circuit is completely manufactured, and it lacks design flexibility.

In order to solve the problem wherein the sensitivity of the conventional design is limited to the wide bandwidth design and is not adjustable, and in order to further increase the design flexibility of the wake-up receiver, the invention proposes a novel circuit structure for a wireless receiving device and a novel technique for frequency-band calibration of the corresponding wireless receiving device. Such a design can not only maintain the narrow band operation of a circuit, so as to increase the receiving sensitivity, but also includes tunable frequency designs (including tunable bandwidth and frequency), so as to increase the design flexibility of the wake-up receiver, and make the wireless receiving device circuit widely applicable in a variety of wireless communication systems.

BRIEF SUMMARY OF THE DISCLOSURE

A wireless receiving device, a wake-up receiver and a method for calibrating a frequency and a bandwidth are provided. An exemplary embodiment of a wireless receiving device comprises a wake-up receiver, a main receiver and a calibration circuit. The wake-up receiver operates in a monitoring mode or a sleep mode. When operating in the monitoring mode, the wake-up receiver monitors whether a request signal is transmitted by a communication device and issues a wake-up signal after receiving the request signal. The main receiver operates in a sleep mode or a transmission mode. When operating in the sleep mode, the main receiver is woken up and enters the transmission mode to transmit and receive data to and from the communication device when receiving the wake-up signal. The calibration circuit is coupled to the wake-up receiver and the main receiver and configured to receive a calibration signal from the main receiver and calibrate a reception frequency of the wake-up receiver in the background in response to the calibration signal.

An exemplary embodiment of a wake-up receiver comprises an amplifier circuit, a negative resistance device and a variable capacitor. The amplifier circuit operates in an amplifying mode and a self-oscillating mode. When the amplifier circuit operates in the amplifying mode, the amplifier circuit is configured to receive a pair of input signals and amplify the pair of input signals to generate a pair of output signals. The negative resistance device and the variable capacitor are coupled to the amplifier circuit and act as a loading circuit of the amplifier circuit. In a background calibration mode of the wake-up receiver, a transconductance of the negative resistance device is adjusted in response to a control voltage or a control current, for making the amplifier circuit leave the amplifying mode and enter the self-oscillating mode, so as to calibrate a reception frequency of the wake-up receiver.

An exemplary embodiment of a method for calibrating a frequency and a bandwidth, suitable for a wireless receiving device comprising a wake-up receiver, a main receiver and a calibration circuit, wherein the wake-up receiver operates in a monitoring mode or a sleep mode, and comprises an amplifier circuit, when the wake-up receiver operates in the monitoring mode, the wake-up receiver monitors a request signal in a wireless communication environment and issues a wake-up signal after receiving the request signal to wake up the main receiver, the method comprises: when the wake-up receiver operates in the sleep mode or leaves the monitoring mode, entering a background calibration mode in response to a calibration signal; and in the background calibration mode, calibrating a reception frequency and/or a reception bandwidth of the wake-up receiver in the background according to a control voltage or a control current.

It should be understood, however, that this summary may not contain all of the aspect and embodiments of the disclosure and is therefore not meant to be limiting or restrictive in any manner. Also the disclosure would include improvements and modifications which are obvious to one skilled in the art.

BRIEF DESCRIPTION OF DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF THE INVENTION

Figure 1:
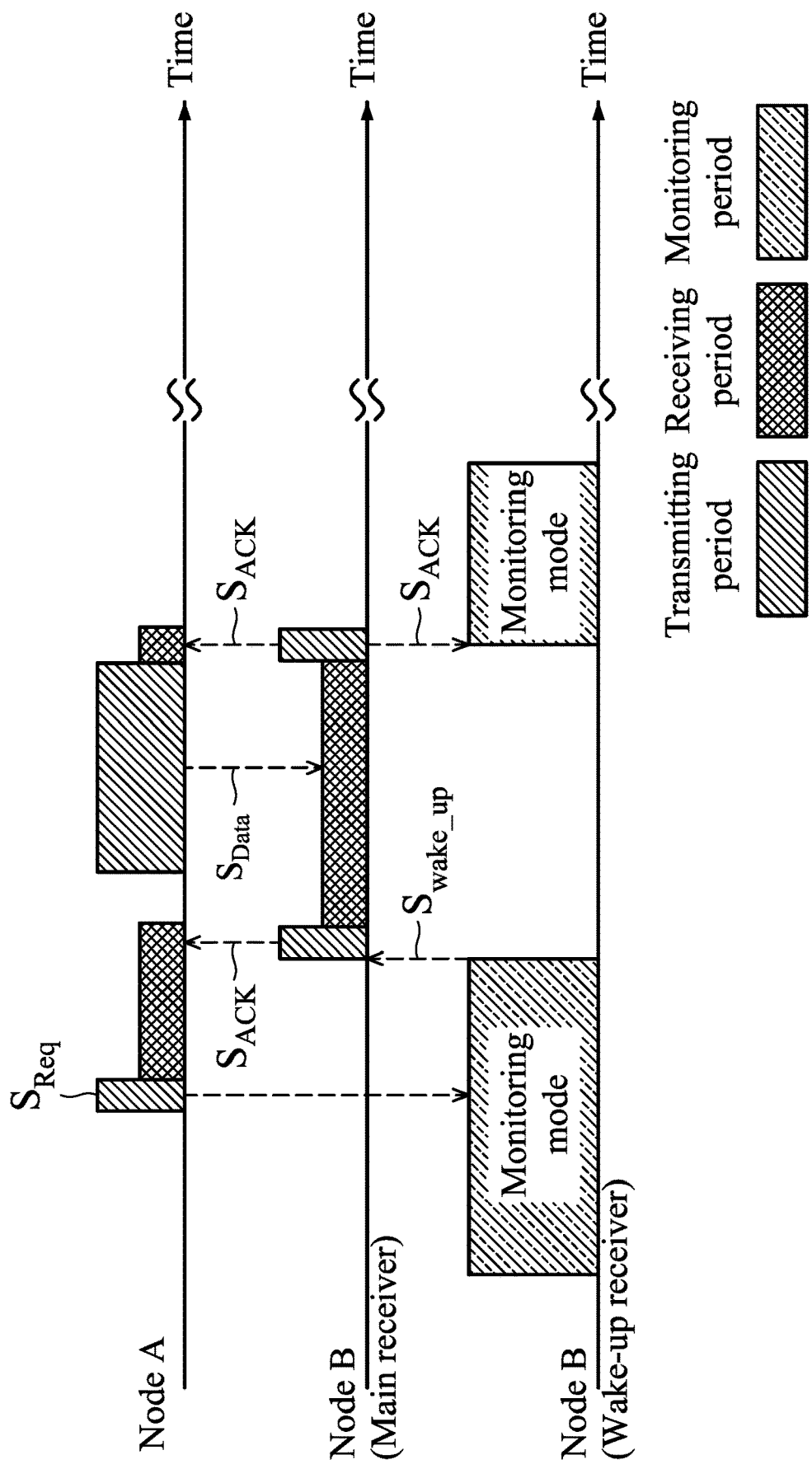
FIG. 1 is an exemplary timing diagram showing the operations of a general main receiver and wake-up receiver.

Reference will now be made in detail to the present exemplary embodiments of the disclosure, examples of which are illustrated in the accompanying drawings. Wherever possible, the same reference numbers are used in the drawings and the description to refer to the same or like parts.

As discussed above, in order to reduce the power consumption, the wireless communication device in a wireless transmission node can be generally separated in two parts, including a wake-up receiver and a main receiver. The main receiver may operate in a sleep mode or a transmission mode. The wake-up receiver may operate in a monitoring mode or a sleep mode. When there is no data transmission requirement, the main receiver may operate in the sleep mode for reducing the power consumption. Meanwhile, the wake-up receiver may operate in the monitoring mode for monitoring or detecting whether there is any communication device issues a request signal in the wireless communication environment. When the wake-up receiver receives the request signal, the wake-up receiver issues a wake-up signal to wake up the main receiver.

FIG. 1 is an exemplary timing diagram showing the operations of the general main receiver and wake-up receiver. As shown in FIG. 1, the nodes A and B represent the communication device in a wireless communication environment. The wireless receiving device of the node B may comprise a main receiver and a wake-up receiver. The main receiver may operate in the sleep mode by default for reducing the power consumption. Meanwhile, the wake-up receiver of the node B may operate in the monitoring mode for monitoring or detecting whether there is any communication device issues a request signal $S_{Req}$ in the wireless communication environment. When the wake-up receiver of the node B receives the request signal $S_{Req}$ transmitted by the node A, the wake-up receiver issues a wake-up signal $S_{wake\_up}$ to wake up the main receiver of the node B. After waking up the main receiver of the node B, the wake-up receiver of the node B may enter the sleep mode.

The main receiver operating in the sleep mode is woken up in response to the wake-up signal $S_{wake\_up}$, so as to leave the sleep mode and enter the transmission mode. In the transmission mode, data transmission is performed between the main receiver of the node B and the node A. For example, transmissions of the data signal $S_{Data}$ and the acknowledgment signal $S_{ACK}$ may be performed therebetween. When the main receiver of the node B finishes the data transmission, the main receiver may notify the wake-up receiver that the data transmission is finished, so as to make the wake-up receiver leave the sleep mode and enter/resume operating in the monitoring mode. Meanwhile, the main receiver of the node B may leave the transmission mode and enter the sleep mode, for reducing the power consumption.

A typical wireless receiving device can utilize external components, such as a surface acoustic wave (SAW) component (for example, a filter), by using micro-electromechanical technology. However, the operating frequency of the external components cannot be adjusted after the circuit is completely manufactured, which lacks of design flexibility. In addition, because of the cost of using external components is high, the reception bandwidth of the wireless receiving device must be designed to be large enough to overcome the effects of frequency offset. However, the broadband design will reduce the sensitivity of the receiver. In other words, in the design of a general wireless receiving device, the sensitivity of the receiver will be limited by the width of the reception bandwidth.

To improve the lack of general design and increase the design flexibility of the wake-up receiver, the invention proposes a novel circuit structure of a wireless receiving device and a novel technique for frequency-band calibration of the corresponding wireless receiving device. Such a design can not only maintain the narrow band operation of the circuit, so as to increase the receiving sensitivity, but also include tunable frequency designs (including tunable bandwidth and frequency), so as to increase the design flexibility of wake-up receiver, and make the wireless receiving device circuit widely applicable in a variety of wireless communication systems.

Figure 2:
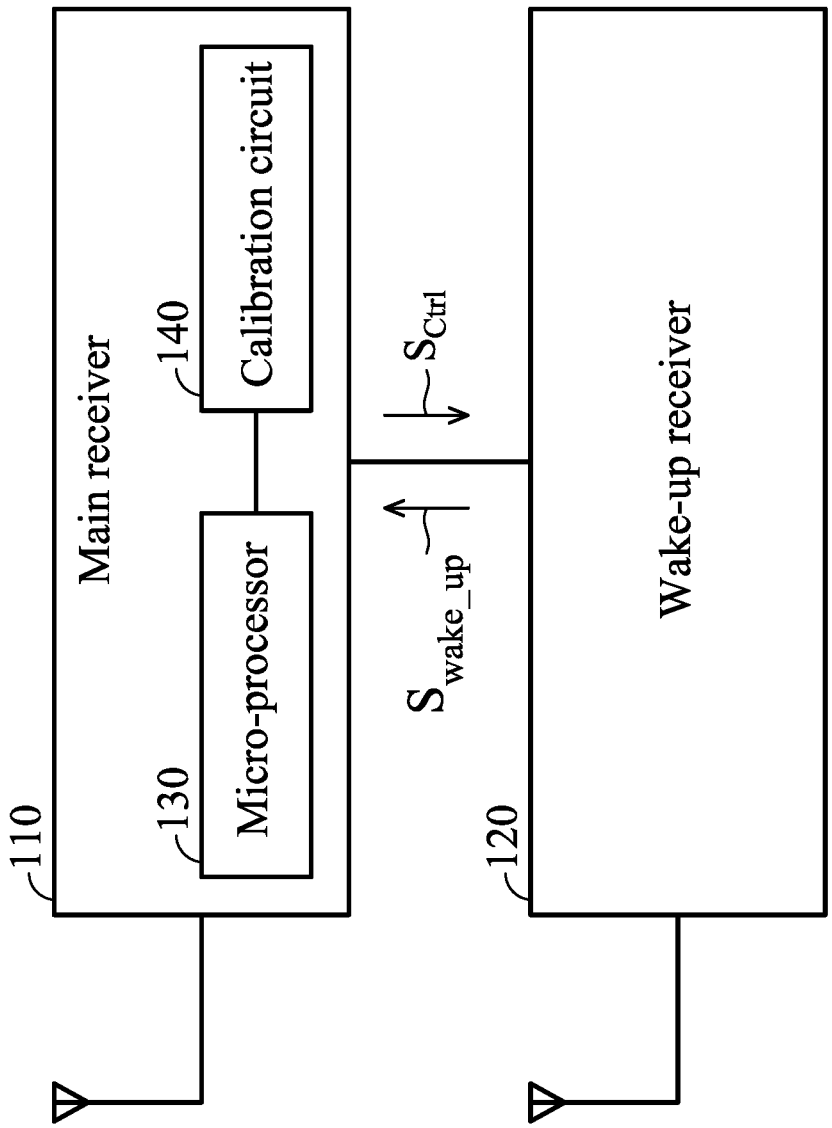
FIG. 2 shows an exemplary block diagram of a wireless receiving device according to an embodiment of the invention.

FIG. 2 shows an exemplary block diagram of a wireless receiving device according to an embodiment of the invention. According to an embodiment of the invention, the wireless receiving device 100 may comprise a main receiver 110 and a wake-up receiver 120. As discussed above, the main receiver 110 may operate a sleep mode or a transmission mode. The wake-up receiver 120 may operate in a monitoring mode or a sleep mode. When there is no data transmission requirement, the main receiver 110 may operate in the sleep mode for reducing the power consumption. Meanwhile, the wake-up receiver 120 may operate in the monitoring mode for monitoring or detecting whether there is any communication device issues a request signal in the wireless communication environment. When the wake-up receiver 120 receives the request signal, the wake-up receiver issues a wake-up signal $S_{wake\_up}$ to wake up the main receiver 110.

The main receiver operating in the sleep mode is woken up in response to the wake-up signal $S_{wake\_up}$, so as to leave the sleep mode and enter the transmission mode. In the transmission mode, data transmission is performed between the main receiver 110 and another communication device node. When the main receiver 110 finishes the data transmission, the main receiver 110 may notify the wake-up receiver 120 that the data transmission is finished, so as to make the wake-up receiver 120 leave the sleep mode and enter/resume operating in the monitoring mode. Meanwhile, the main receiver 110 may leave the transmission mode and enter/resume operating in the sleep mode, again, for reducing the power consumption.

According to an embodiment of the invention, the wireless receiving device 100 may further comprise a calibration circuit for calibrating a reception frequency and/or reception bandwidth of the wake-up receiver 120 in the background. As shown in FIG. 2, in an embodiment of the invention, the calibration circuit 140 is configured inside of the main receiver 110 and is coupled to the micro-processor 130. However, the invention should not be limited thereto. For example, in other embodiment of the invention, the calibration circuit 140 may also be configured inside of the wake-up receiver 120, or may be configured outside of the main receiver 110 and the wake-up receiver 120.

The calibration circuit 140 is coupled to the main receiver 110 and the wake-up receiver 120, receives a calibration signal from the main receiver 110 and begins a frequency and bandwidth calibration procedure in response to the calibration signal, so as to calibrate the reception frequency and/or reception bandwidth of the wake-up receiver 120 in the background. According to an embodiment of the invention, the term "calibrate the reception frequency and/or reception bandwidth of the wake-up receiver 120 in the background" means that the calibration behavior of the wake-up receiver 120 does not affect the original operation and functionalities of the main receiver 110. To be more specific, the calibration behavior of the wake-up receiver 120 does not affect the data transmissions of the main receiver 110 in the transmission mode and does not affect the operations of the main receiver 110 in the sleep mode. According to an embodiment of the invention, the calibration signal may be the acknowledgment signal $S_{ACK}$ transmitted by the main receiver 110 when the data transmission is finished, or may be any control signal transmitted when the main receiver 110 would like to calibrate the frequency and bandwidth of the wake-up receiver 120. In the background calibration mode, the calibration circuit 140 may generate or output a control signal, a control current of a control voltage (uniformly represented by the control signal $S_{Ctrl}$ in the figure), for controlling the corresponding reception frequency and/or reception bandwidth of the wake-up receiver 120. Note that in other embodiments of the invention, the control signal $S_{Ctrl}$ may also be a control signal for triggering the wake-up receiver 120 to enter the background calibration mode and may be generated or output by the main receiver 110.

Figure 3:
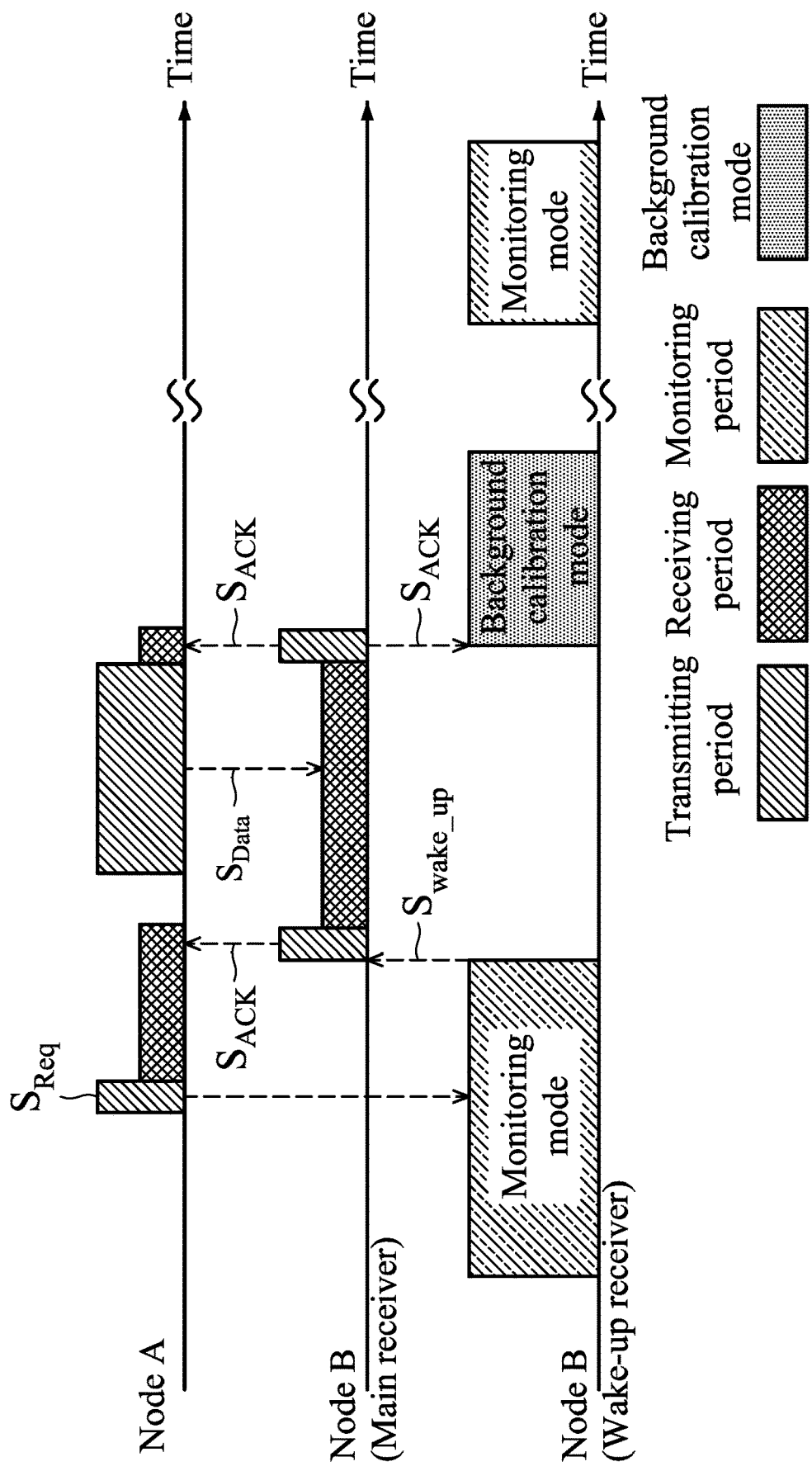
FIG. 3 is an exemplary timing diagram showing the operations of the main receiver and the wake-up receiver according to an embodiment of the invention.

FIG. 3 is an exemplary timing diagram showing the operations of the main receiver and the wake-up receiver according to an embodiment of the invention. According to an embodiment of the invention, besides operating in the monitoring mode or the sleep mode, the wake-up receiver 120 may further operate in a background calibration mode. For example, after the main receiver 110 finishes the data transmission, the main receiver 110 may also transmit the acknowledgment signal $S_{ACK}$ or any control signal (uniformly called the calibration signal in the following paragraphs) to the calibration circuit 140 and/or the wake-up receiver 120, making the wake-up receiver enter the background calibration mode. Therefore, in an embodiment of the invention, when the wake-up receiver 120 leaves the monitoring mode or operating in the sleep mode, the wake-up receiver 120 may enter the background calibration mode in response to the calibration signal.

Note that in other embodiment of the invention, the main receiver 110 may also control the wake-up receiver 120 to enter the background calibration mode to calibrate a reception frequency of the wake-up receiver 120 in the background when the wireless receiving device 100 initially starts up, before the data transmission begins, or even during the data transmission. In other words, in the embodiment of the invention, the time for the wake-up receiver 120 to enter the background calibration mode and calibrate the reception frequency is no limited to any specific time. For example, the main receiver 110 or the calibration circuit 140 may control the wake-up receiver 120 to calibrate the reception frequency and the reception bandwidth at any time as long as the wake-up receiver 120 does not operate in the monitoring mode.

Figure 4:
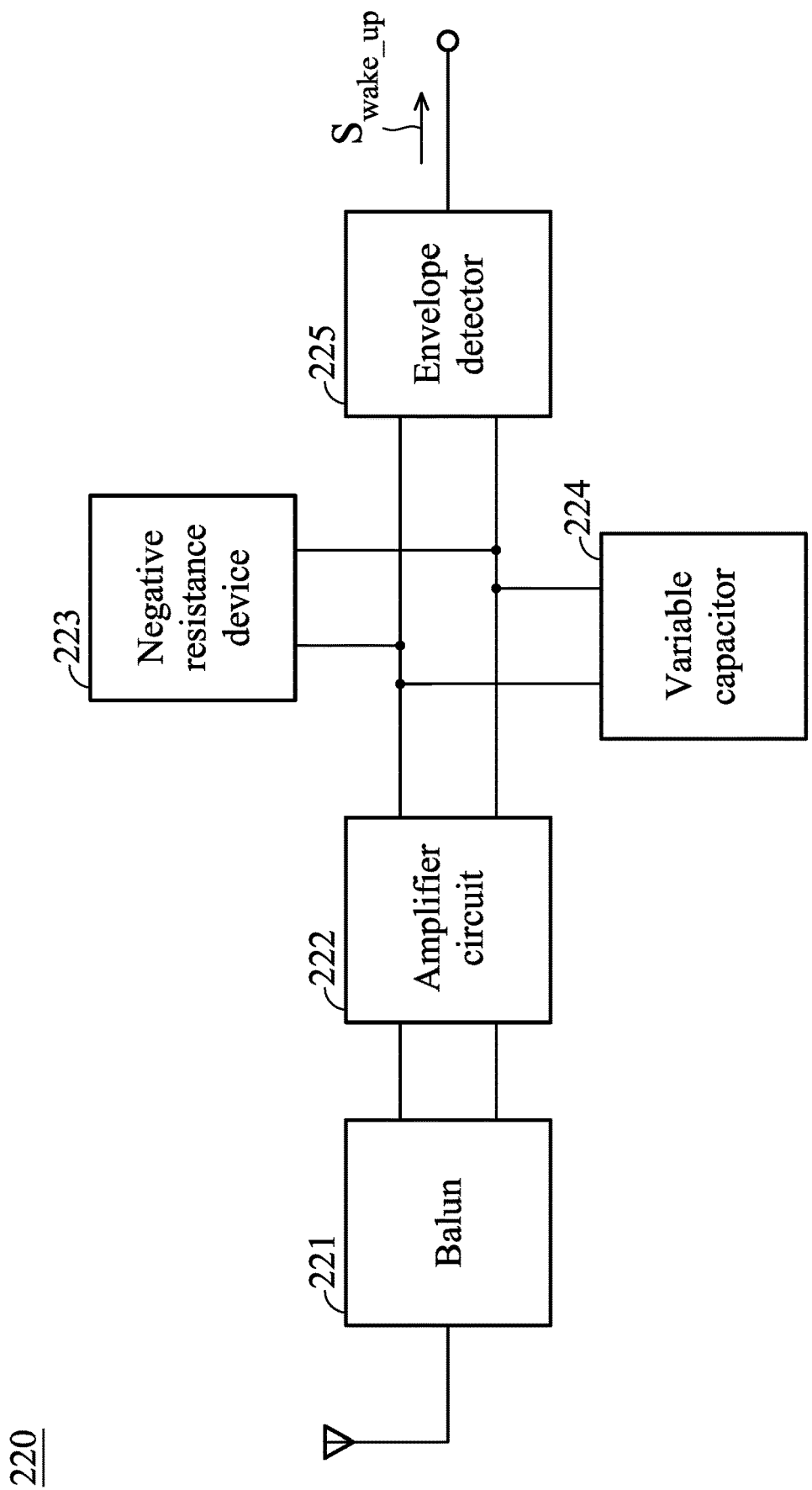
FIG. 4 shows an exemplary block diagram of a wake-up receiver according to an embodiment of the invention.

FIG. 4 shows an exemplary block diagram of a wake-up receiver according to an embodiment of the invention. According to an embodiment of the invention, the wake-up receiver 220 may comprise a balance-unbalance transformer (Balun) 221, an amplifier circuit 222, a negative resistance device 223, a variable capacitor 224 and an envelope detector 225. The Balun 221 transforms a single-ended signal into a pair of differential input signals. The amplifier circuit 222 is configured to receive the pair of input signals and output the pair of input signals to generate a pair of output signals. According to an embodiment of the invention, the amplifier circuit 222 may be a low noise amplifier. The negative resistance device 223 may be formed by one or more active devices, which contributes an adjustable transconductance, wherein the value of the transconductance may be a negative resistance value. The variable capacitor 224 may be formed by one or more active devices, which contributes an adjustable capacitance. The envelop detector 225 is coupled to the output terminals of the amplifier circuit 222 and configured to detect envelops of the output signals and generate the wake-up signal $S_{wake-up}$.

According to an embodiment of the invention, the negative resistance device 223 and the variable capacitor 224 may be coupled to the output terminals of the amplifier circuit 222 and act as a loading circuit of the amplifier circuit 222. The amplifier circuit 222 may operate in an amplifying mode or a self-oscillating mode. When the wake-up receiver 120/220 operates in the monitoring mode, the amplifier circuit 222 operates in the amplifying mode for amplifying the input signals. When the wake-up receiver 120/220 operates in the background calibration mode, a transconductance of the negative resistance device 223 may be adjusted in response to a control voltage or a control current provided by the calibration circuit 140, so as to make the amplifier circuit 222 leave the amplifying mode and enter the self-oscillating mode and the reception frequency of the wake-up receiver 220 will be calibrated in the self-oscillating mode.

Figure 5:
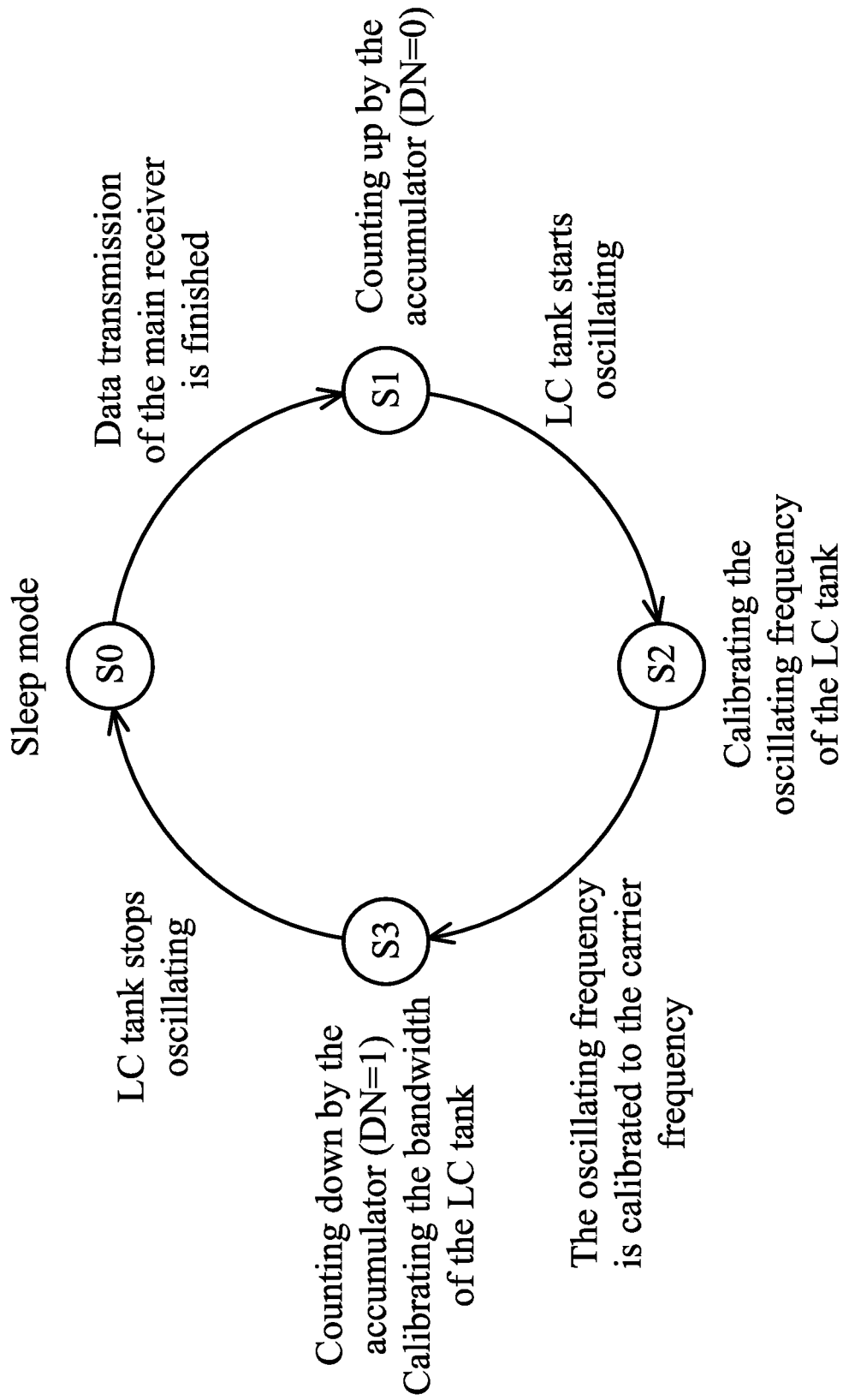
FIG. 5 is a schematic diagram showing the state machine when the wake-up receiver operates in the background calibration mode according to an embodiment of the invention.

FIG. 5 is a schematic diagram showing the state machine when the wake-up receiver operates in the background calibration mode according to an embodiment of the invention. According to an embodiment of the invention, the micro-processor 130 may perform scheduling based on the state machine when the wake-up receiver operates in the background calibration mode, so as to control the frequency and bandwidth calibration procedure. In addition, according to other embodiments of the invention, the wireless receiving device 100 may also comprise specific control hardware circuits for controlling the frequency and bandwidth calibration procedure based on the state machine.

There are four states S0, S1, S2 and S3 in the state machine. In the state S0, the wake-up receiver 120/220 operates in the sleep mode and the main receiver 110 operates in the transmission mode for data transmission. When the main receiver 110 finishes data transmission, or when the main receiver 110 would like to calibrate the frequency and bandwidth of the wake-up receiver 120, the micro-processor 130 or the corresponding control hardware circuit may issue a calibration signal to the wake-up receiver 120/220 or the calibration circuit 140. At this time, the frequency and bandwidth calibration procedure goes into the state S1.

In the state S1, the micro-processor 130 or the corresponding hardware control circuit sets a control voltage DN of an accumulator (shown in FIG. 6) inside of the calibration circuit 140 to a low voltage level (for example, DN=0), for controlling the accumulator to perform a counting-up operation. The accumulated value output by the accumulator of the calibration circuit 140 may be converted into a control voltage or a control current, for adjusting the transconductance of the negative resistance device 223 and making the amplifier circuit 222 leave the amplifying mode and enter the self-oscillating mode. Meanwhile, the frequency and bandwidth calibration procedure goes into the state S2. In the self-oscillating mode, the amplifier circuit 222 can generate an output signal without receiving an input signal.

According to an embodiment of the invention, when the amplifier circuit 222 has entered the self-oscillating mode, the accumulator stops the counting-up operation, so as to stop adjusting the transconductance of the negative resistance device 223.

In the state S2, the amplifier circuit 222 operates in the self-oscillating mode and the negative resistance device 223 and the variable capacitor 224 form an LC tank. The oscillating frequency of the amplifier circuit 222 (that is, the reception frequency to be calibrated) can be obtained by the oscillating operation of the LC tank. In the state S2, some specific circuits in the main receiver 110 or in the calibration circuit 140 integrating with the LC tank can form a phase-locked loop (PLL), such that the oscillating frequency of the LC tank can be adjusted according to a reference frequency $F_{ref}$. The reference frequency $F_{ref}$ may be designed based on the required carrier frequency of the wireless communication system. For example, the required carrier frequency may be N times the reference frequency $F_{ref}$, where N is a positive number.

The main receiver 110 or the calibration circuit 140 may generate a control signal $V_{ctrl}$ based on a comparison result of the reception frequency and the reference frequency $F_{ref}$, for adjusting a capacitance of the variable capacitor 224. By adjusting the capacitance of the variable capacitor 224, the oscillating frequency of the LC tank will be adjusted, accordingly, so as to calibrate the reception frequency of the wake-up receiver 120/220.

When the reception frequency calibration of the wake-up receiver 120/220 is completed, the frequency and bandwidth calibration procedure goes into the state S3. In the state S3, the micro-processor 130 or the corresponding hardware control circuit sets a control voltage DN of an accumulator inside of the calibration circuit 140 to a high voltage level (for example, DN=1), for controlling the accumulator to perform a counting-down operation. The accumulated value output by the accumulator of the calibration circuit 140 may be converted into a control voltage or a control current, for adjusting the transconductance of the negative resistance device 223 and making the amplifier circuit 222 leave the self-oscillating mode and enter or return to the amplifying mode. Meanwhile, the LC tank stop oscillating and the frequency and bandwidth calibration procedure goes back to the state S0.

According to an embodiment of the invention, the reception bandwidth of the wake-up receiver 120/220 is adjusted at the same time while the calibration circuit 140 adjusts the transconductance of the negative resistance device 223, and the calibration circuit 140 stops adjusting the transconductance of the negative resistance device 223 by stopping the counting-down operation of the accumulator when the amplifier circuit leaves the self-oscillating mode. In this manner, since the transconductance of the negative resistance device 223 is adjusted to an oscillation threshold (that is, a threshold or a boundary value at which the LC tank is switched from oscillating to not oscillating) or to a value approaches the oscillation threshold, the reception bandwidth of the amplifier circuit 222 may be adjusted to the narrowest bandwidth that the self-oscillation does not occur.

By the bandwidth adjustment as discussed above, the wake-up receiver 120/220 can maintain narrow band operation, so as to increase the receiving sensitivity. According to an embodiment of the invention, the reception bandwidth of the wake-up receiver 120/220 can be well-controlled to be less than 1 MHz.

Figure 6:
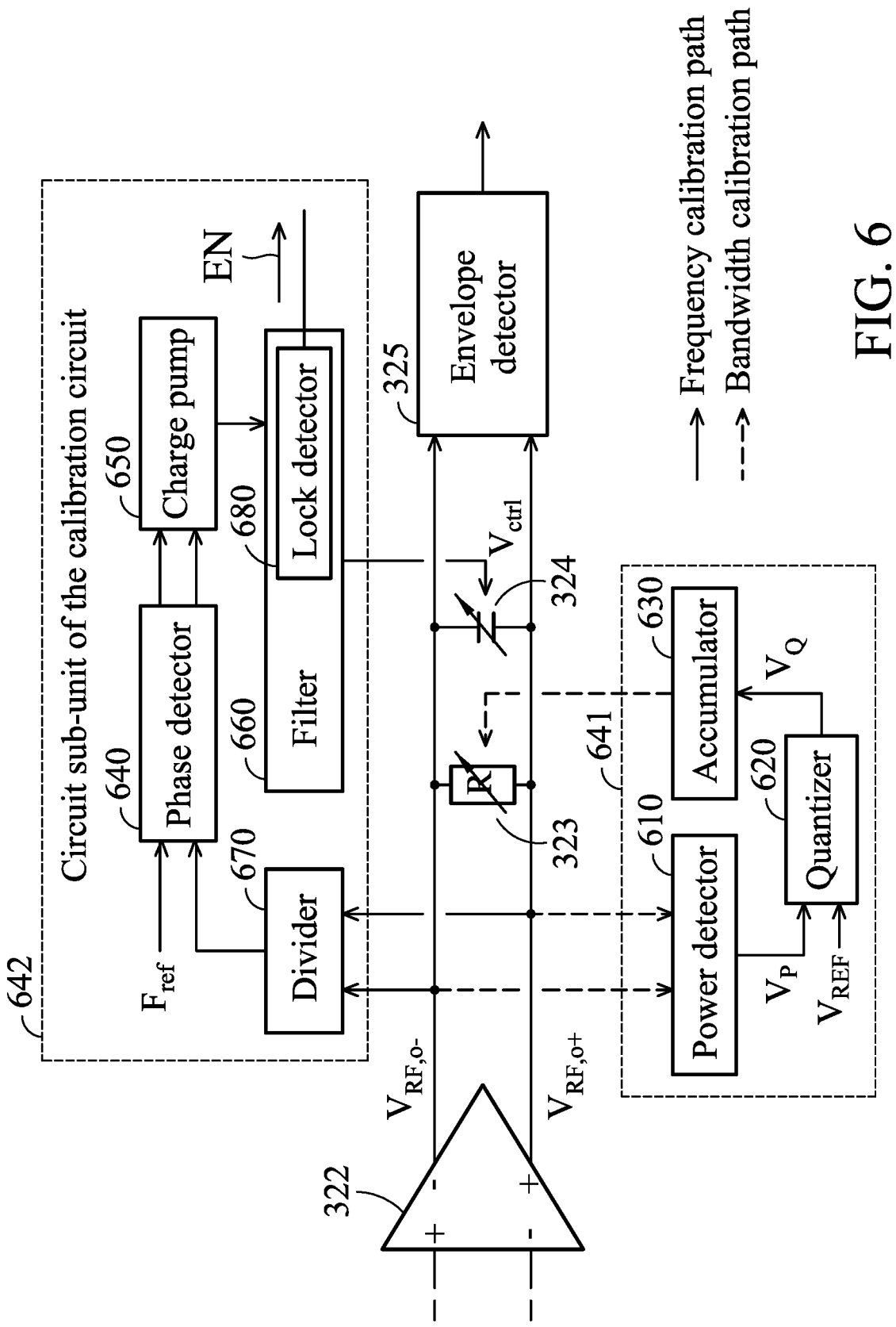
FIG. 6 is a detailed circuit diagram showing a portion of the calibration circuit and the wake-up receiver according to an embodiment of the invention.

FIG. 6 is a detailed circuit diagram showing a portion of the calibration circuit and the wake-up receiver according to an embodiment of the invention. The portion of the wake-up receiver circuit may comprise the amplifier circuit 322, the negative resistance device 323, the variable capacitor 324 and the envelop detector 325. The calibration circuit may comprise two circuit sub-units 641 and 642.

As discussed above, in the embodiments of the invention, the calibration circuit may be configured inside of the main receiver 110, inside of the wake-up receiver 120, or configured outside of the main receiver 110 and the wake-up receiver 120. The invention is not limited to any specific configuration. For example, according to an embodiment of the invention, the circuit sub-unit 641 of the calibration circuit may be configured outside of the main receiver 110 and the wake-up receiver 120, and the circuit sub-unit 642 of the calibration circuit may be configured inside of the main receiver 110.

Accompanying the state machine shown in FIG. 5 and the circuits shown in FIG. 6-FIG. 11, the proposed method for calibrating a frequency and a bandwidth and the corresponding circuit operations will be discussed in more detailed in the following paragraphs.

The circuit sub-unit 641 of the calibration circuit may comprise a power detector 610, a quantizer 620 and an accumulator 630. The power detector 610 is configured to receive the output signals $V_{RF,o-}$ and $V_{RF,o+}$ generated by the amplifier circuit 322, detect the amplitude of the output signals, and accordingly generate a direct current (DC) power indication voltage $V_p$.

Figure 7:
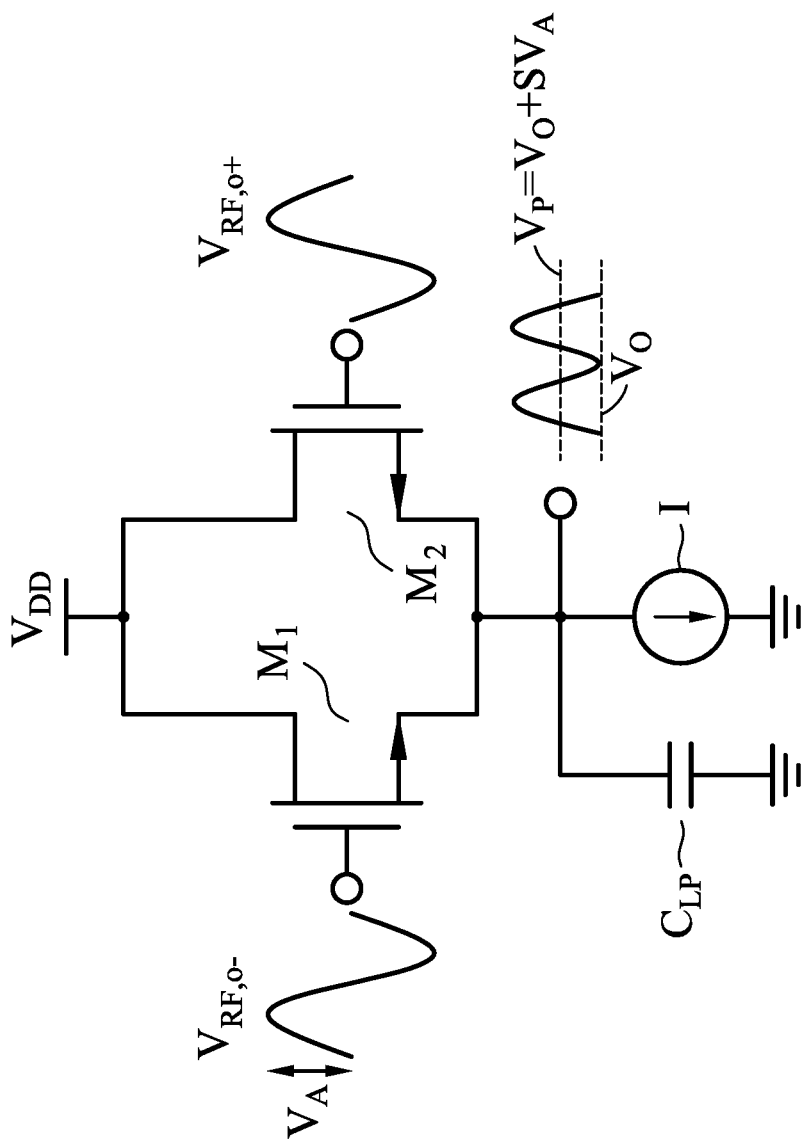
FIG. 7 shows an exemplary circuit diagram of a power detector according to an embodiment of the invention.

FIG. 7 shows an exemplary circuit diagram of a power detector according to an embodiment of the invention. The power detector 710 may comprise a pair of transistors $M_1$ and $M_2$ coupled to the system voltage $V_{DD}$ and configured to receive the output signals $V_{RF,o-}$ and $V_{RF,o+}$ generated by the amplifier circuit 322. The on-off statuses of the transistors $M_1$ and $M_2$ are controlled by the output signals $V_{RF,o-}$ and $V_{RF,o+}$, so as to generate a current I. A low pass filter is formed by the capacitor $C_{LP}$, and the DC power indication voltage $V_p$ is generated at the output node, where $V_P = V_0 + SV_A$, $V_A$ is the amplitude of the output signals $V_{RF,o-}$ and $V_{RF,o+}$, $V_0$ is the DC output voltage of the power detector 710, S is the output gain of the power detector 710. Note that the circuit of the power detector 710 shown in FIG. 7 is only one of a various implementation circuits of the invention, and the invention is not limited to this implementation circuit.

The DC power indication voltage $V_p$ is provided to the quantizer 620. According to an embodiment of the invention, the calibration circuit may determine whether to adjust the transconductance of the negative resistance device based on a comparison result of the output signals generated by the amplifier circuit and a predetermined voltage threshold $V_{REF}$. To be more specific, by comparing the power indication voltage $V_p$ with the predetermined voltage threshold $V_{REF}$, the quantizer 620 may determine whether the amplifier circuit is currently operating in the amplifying mode or the self-oscillating mode, and accordingly outputs the control voltage $V_Q$ to the accumulator 630 for controlling the counting operation thereof.

Figure 8:
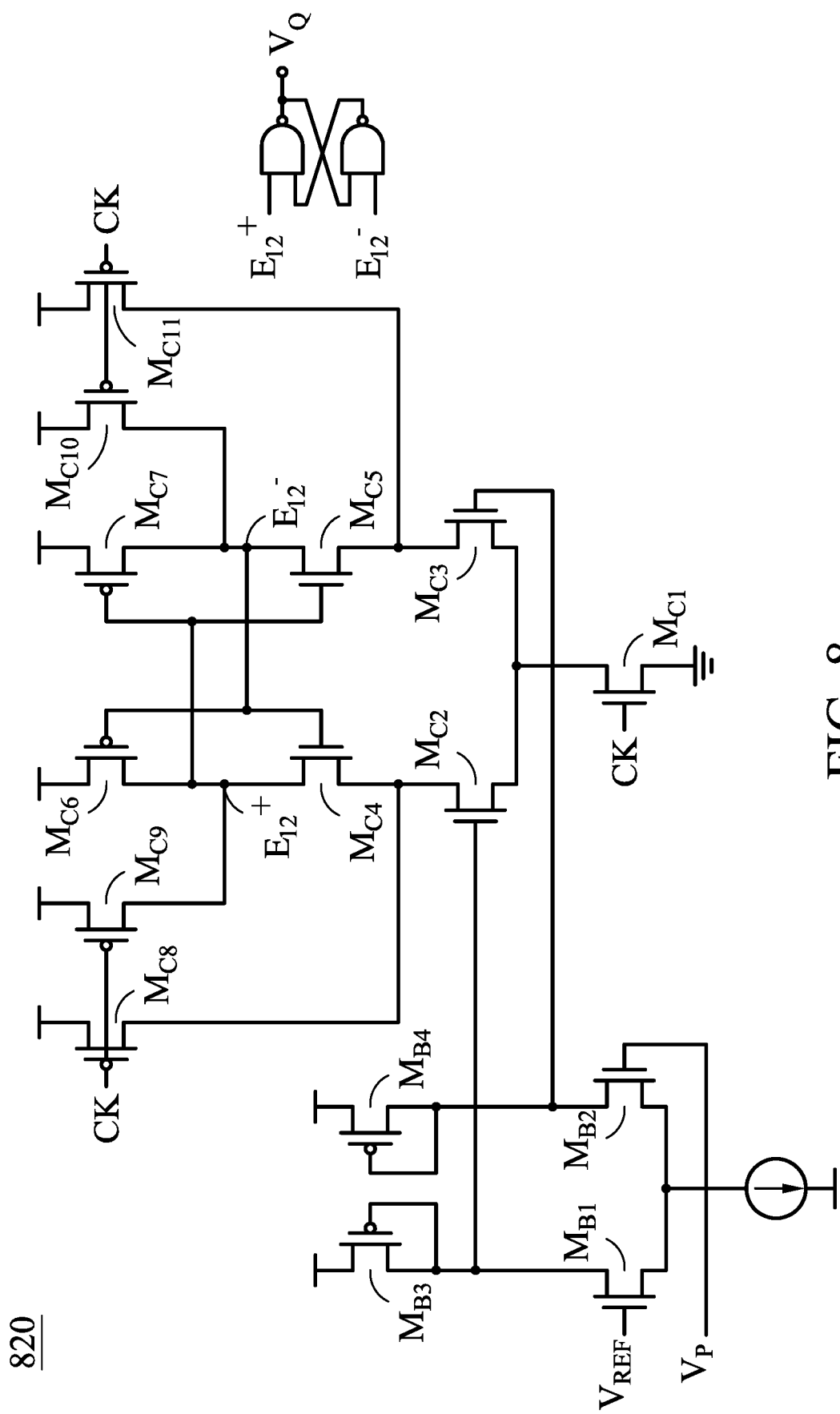
FIG. 8 shows an exemplary circuit diagram of a quantizer according to an embodiment of the invention.

FIG. 8 shows an exemplary circuit diagram of a quantizer according to an embodiment of the invention. The quantizer 820 may comprise multiple pairs of transistors $M_{B1}$, $M_{B2}$, $M_{B3}$, $M_{B4}$, $M_{C1}$, $M_{C2}$, $M_{C3}$, $M_{C4}$, $M_{C5}$, $M_{C6}$, $M_{C7}$, $M_{C8}$, $M_{C9}$, $M_{C10}$ and $M_{C11}$ and a latch. The quantizer 820 operates based on the clock signal CK, so as to compare the power indication voltage $V_p$ with the predetermined voltage threshold $V_{REF}$. The latch is coupled to the terminals $E_{12+}$ and $E_{12-}$ and is configured to output the corresponding control voltage $V_Q$ for controlling the counting operation of the accumulator based on the comparison result of the power indication voltage $V_p$ and the predetermined voltage threshold $V_{REF}$. According to an embodiment of the invention, when the power indication voltage $V_p$ is less than the predetermined voltage threshold $V_{REF}$, the control voltage $V_Q$ generated by the quantizer 820 has a high voltage level (for example, $V_Q=1$), for controlling the accumulator 630 to perform a counting operation.

As discussed above, when the frequency and bandwidth calibration procedure begins, the state S1 is entered. In the state S1, the micro-processor 130 or the corresponding hardware control circuit sets a control voltage DN of the accumulator 630 inside of the calibration circuit 140 to a low voltage level (for example, DN=0), for controlling the accumulator 630 to perform a counting-up operation. The accumulated value output by the accumulator 630 may be converted into a control voltage or a control current, for adjusting the transconductance of the negative resistance device 223 and making the amplifier circuit 222 leave the amplifying mode and enter the self-oscillating mode.

According to an embodiment of the invention, when the power indication voltage $V_p$ is less than the predetermined voltage threshold $V_{REF}$, it means that the amplifier circuit is currently operating in the amplifying mode. Therefore, the accumulator 630 is controlled to keep counting up. When the power indication voltage $V_p$ is not less than the predetermined voltage threshold $V_{REF}$, it means that the amplifier circuit is currently operating in the self-oscillating mode. At this time, the control voltage $V_Q$ generated by the quantizer 820 has a low voltage level (for example, $V_Q=0$), for controlling the accumulator 630 to stop the counting operation.

Note that the circuit of the quantizer 820 shown in FIG. 8 is only one of a various implementation circuits of the invention, and the invention is not limited to this implementation circuit.

Figure 9:
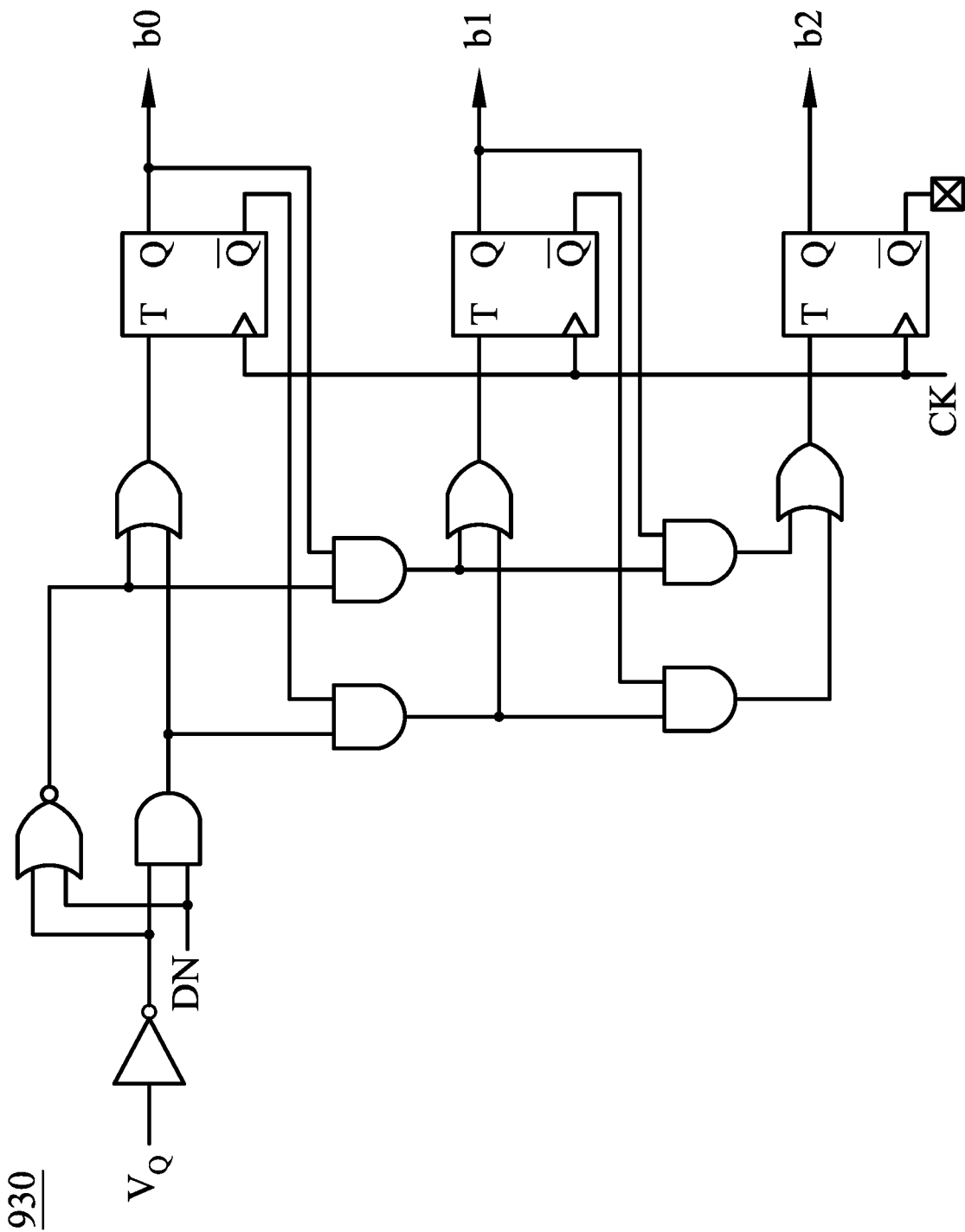
FIG. 9 shows an exemplary circuit diagram of an accumulator according to an embodiment of the invention.

FIG. 9 shows an exemplary circuit diagram of an accumulator according to an embodiment of the invention. The accumulator 930 may comprise a plurality of logic gates and T flip-flops. The accumulator 930 operates based on the clock signal CK, so as to perform the counting-up or counting-down operation according to the control voltages DN and $V_Q$. The accumulator 930 may output a plurality of control bits b0, b1 and b2, for representing the accumulated value (the counting result) of the accumulator 930. The control bits b0, b1 and b2 may be provided to a resistance adjusting circuit. The resistance adjusting circuit converts the accumulated value of the accumulator 930 into a control voltage or a control current, for adjusting the transconductance of the negative resistance device.

Note that the circuit of the accumulator 930 shown in FIG. 9 is only one of a various implementation circuits of the invention, and the invention is not limited to this implementation circuit.

Figure 10A:
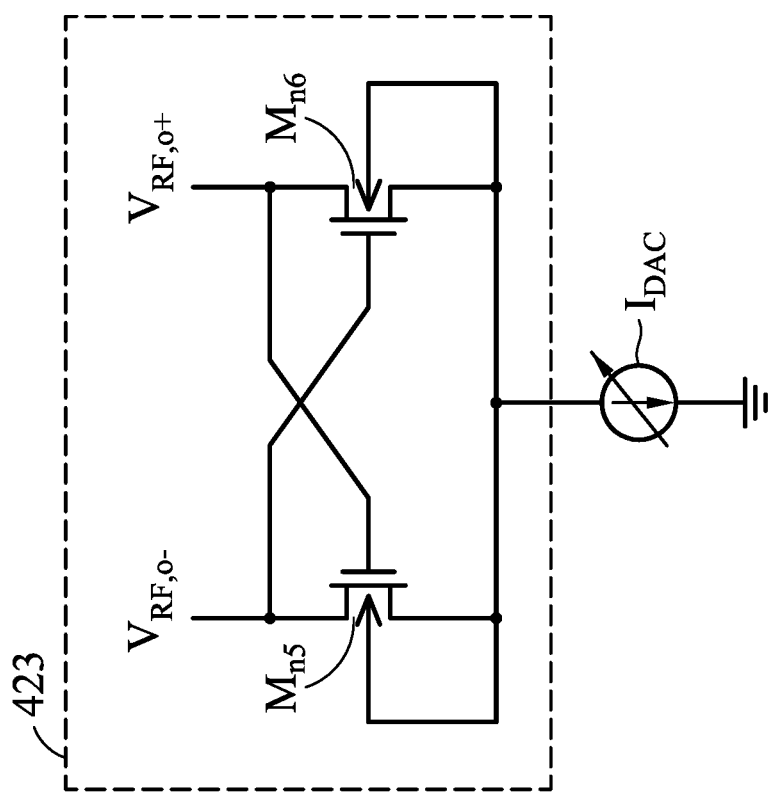
FIG. 10A shows an exemplary circuit diagram of a negative resistance device and the corresponding control current according to an embodiment of the invention.
Figure 10B:
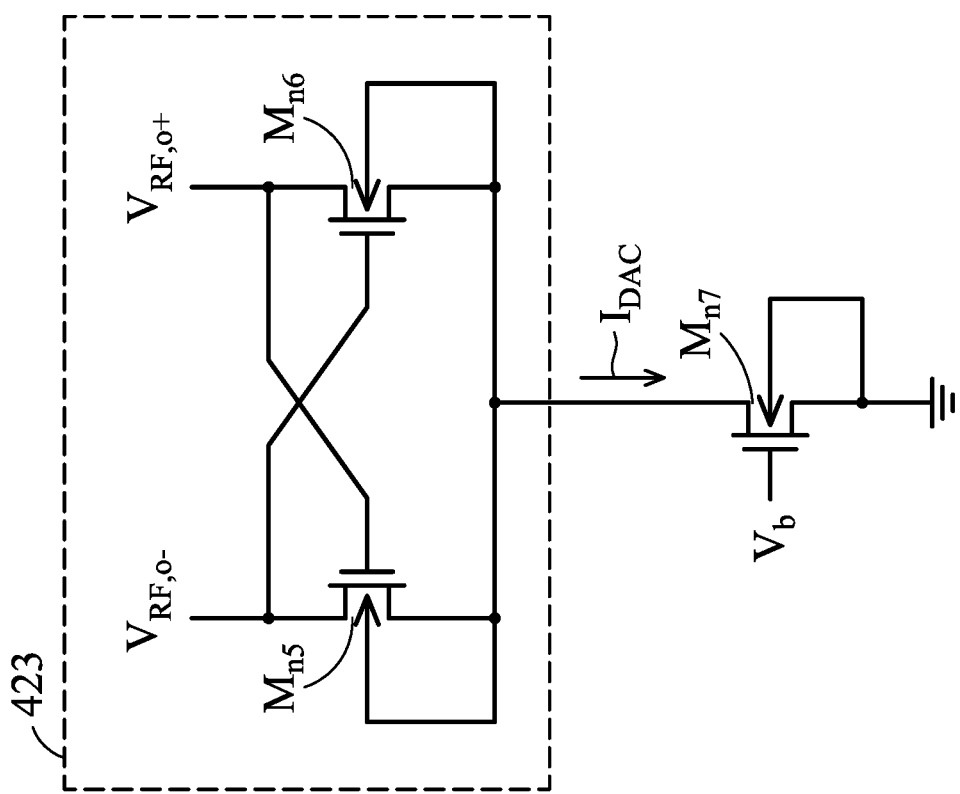
FIG. 10B shows an exemplary circuit diagram of a negative resistance device and the corresponding control voltage according to an embodiment of the invention.

FIG. 10A shows an exemplary circuit diagram of a negative resistance device and the corresponding control current according to an embodiment of the invention. FIG. 10B shows an exemplary circuit diagram of a negative resistance device and the corresponding control voltage according to an embodiment of the invention. Note that the negative resistance device 423 and the corresponding control current/voltage shown in FIG. 10A and FIG. 10B are only two of a various implementation circuits of the invention, and the invention is not limited to this implementation circuit.

According to an embodiment of the invention, the negative resistance device 423 may comprise a plurality of transistors $M_{n5}$ and $M_{n6}$, and may be coupled to a control current $I_{DAC}$ or a transistor $M_{n7}$. As discussed above, in the state S1, the transconductance of the negative resistance device 423 is adjusted in response to the control voltage $V_b$ or the control current $I_{DAC}$, for making the amplifier circuit leave the amplifying mode and enter the self-oscillating mode.

Figure 11:
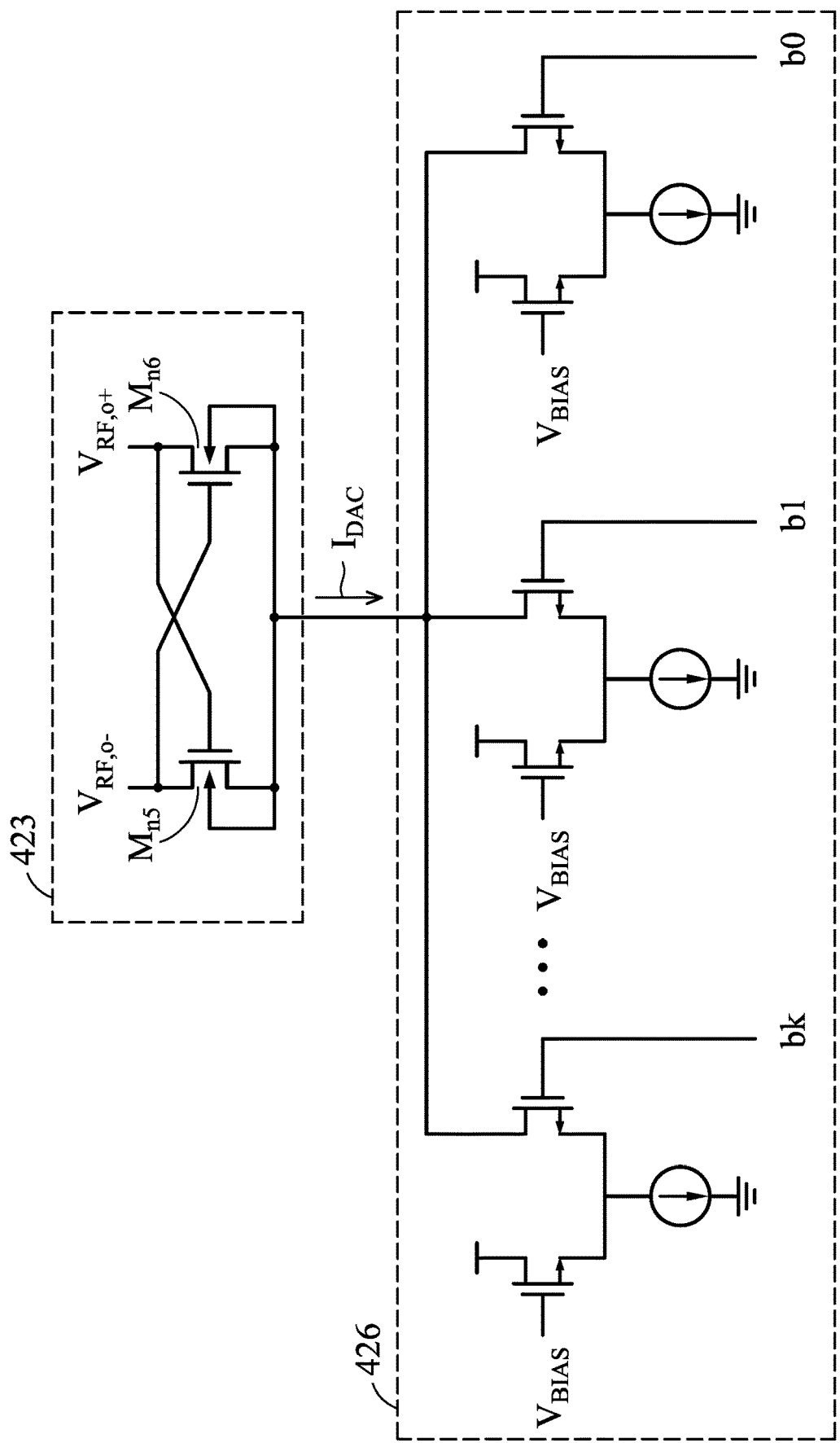
FIG. 11 shows an exemplary circuit diagram of a resistance adjusting circuit according to an embodiment of the invention.

FIG. 11 shows an exemplary circuit diagram of a resistance adjusting circuit according to an embodiment of the invention. The resistance adjusting circuit 426 is coupled to the negative resistance device 423 for controlling the on-off status of a plurality of transistors according to the bias voltage $V_{BIAS}$ and the control bits b0, b1, . . . bk, where k is a positive integer. By controlling the on-off status of the transistors, the amount of current provided by the current sources coupled to the transistors will be changed, accordingly, thereby adjusting the amount of control current $I_{DAC}$. Note that the resistance adjusting circuit 426 shown in FIG. 11 is only one of a various implementation circuits of the invention, and the invention is not limited to this implementation circuit.

As discussed above, in the state S1, by adjusting transconductance of the negative resistance device, the amplifier circuit leaves the amplifying mode and enters the self-oscillating mode. According to an embodiment of the invention, the resistance adjusting circuit 426 adjusts the amount of conducted current, so as to adjust the transconductance of the negative resistance device. When the control current $I_{DAC}$ is increased, the strength of positive feedback of the amplifier circuit is stronger, and the amplifier circuit enters the self-oscillating mode more easily. According to an embodiment of the invention, in the state S1, an absolute value of the transconductance (that is, the absolute transconductance value) of the negative resistance device is decreased in response to the control voltage $V_b$ or the control current $I_{DAC}$, so as to enhance the negative resistive characteristic of the negative resistance device and make the amplifier circuit leave the amplifying mode and enter the self-oscillating mode. For example, the resistance adjusting circuit 426 increases the amount of control current $I_{DAC}$ by decreasing the bias voltage $V_{BIAS}$ or adjusting the amount of conducted current, so as to accordingly decrease the absolute value of the transconductance and enhance the negative resistive characteristic of the negative resistance device, and the amplifier circuit can leave the amplifying mode and enter the self-oscillating mode.

When the amplifier circuit leaves the amplifying mode and enters the self-oscillating mode, the frequency and bandwidth calibration procedure goes into the state S2. In the self-oscillating mode, the amplifier circuit can generate an output signal without receiving an input signal. In addition, according to an embodiment of the invention, when the amplifier circuit enters the self-oscillating mode, the control voltage $V_Q$ has a low voltage level (for example, $V_Q=0$) for controlling the accumulator to stop the counting operation (stop the counting-up operation) since the control voltage $V_p$ becomes a value not less than the predetermined voltage threshold $V_{REF}$. Thereby, the transconductance of the negative resistance device will not be adjusted.

Referring back to FIG. 5 and FIG. 6, in the state S2, the circuit sub-unit 642 of the calibration circuit starts to function in response to the control of the micro-processor 130 or the corresponding control hardware circuit, so as to facilitate the reception frequency calibration of the wake-up receiver. According to an embodiment of the invention, the circuit sub-unit 642 may comprise the circuit components inside of the main receiver. In other words, the circuit components inside of the main receiver may be utilized in the background calibration mode of the wake-up receiver, so as to facilitate the reception frequency calibration of the wake-up receiver.

The circuit sub-unit 642 of the calibration circuit may comprise a phase detector 640, a charge pump 650, a filter 660 and a divider 670. The circuit sub-unit 642 and the LC tank formed by the negative resistance device 323 and the variable capacitor 324 may form a phase locked loop (PLL), for adjusting the oscillating frequency of the LC tank according to a reference frequency $F_{ref}$, thereby calibrating the reception frequency of the wake-up receiver 120/220.

Figure 12:
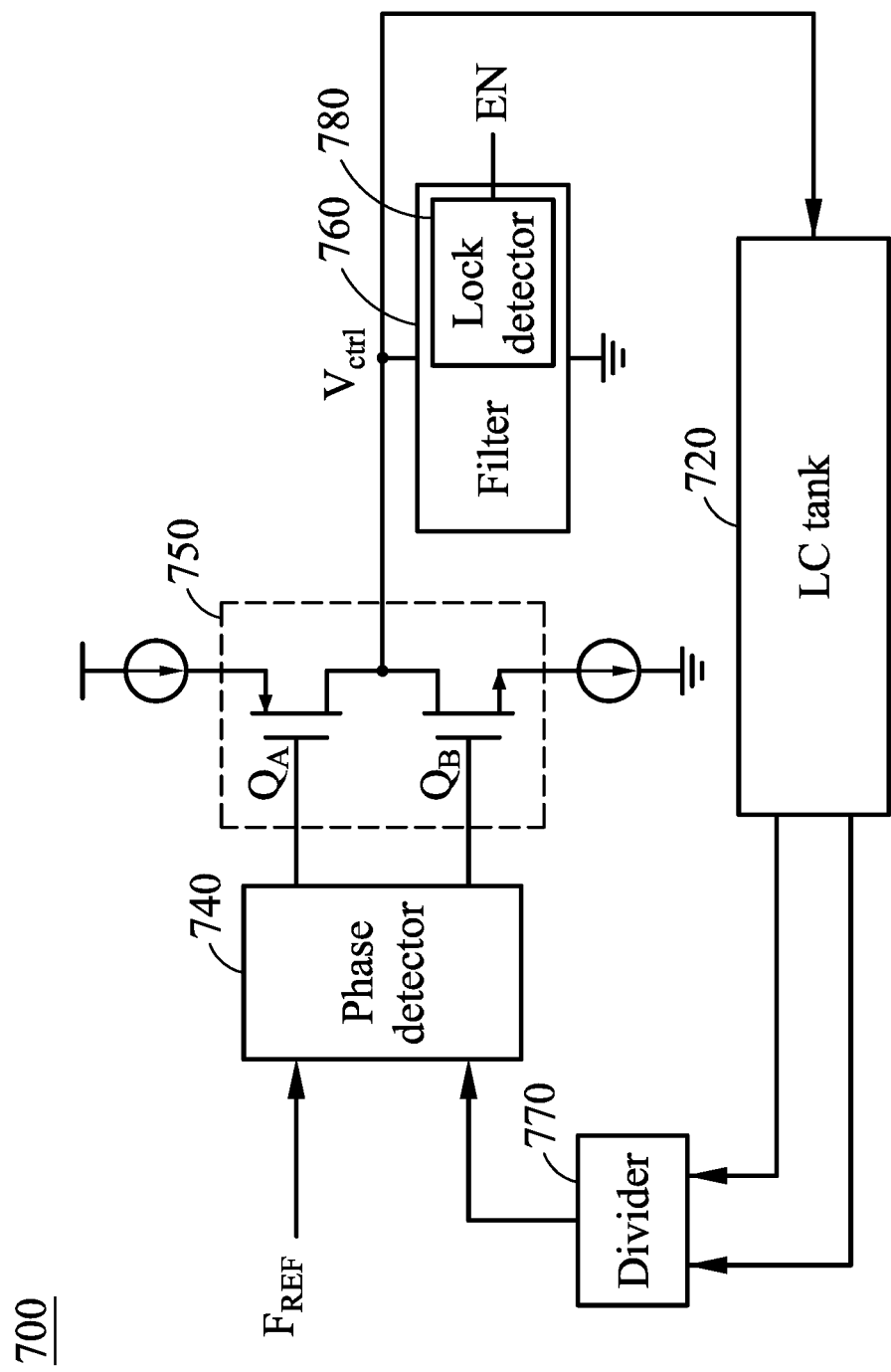
FIG. 12 shows an exemplary circuit diagram of a phase locked loop according to an embodiment of the invention.

FIG. 12 shows an exemplary circuit diagram of a phase locked loop according to an embodiment of the invention. The PLL 700 may comprise an LC tank 720, a phase detector 740, a charge pump 750 formed by the transistors $Q_A$ and $Q_B$, a filter 760 and a divider 770. The LC tank 720 is formed by the negative resistance device 323 and the variable capacitor 324 of the wake-up receiver, and acts as the voltage-controlled oscillator (VCO) of the PLL 700. Note that the PLL 700 shown in FIG. 12 is only one of a various implementation circuits of the invention, and the invention is not limited to this implementation circuit.

As discussed above, the reference frequency $F_{ref}$ may be designed based on the required carrier frequency of the wireless communication system. For example, the required carrier frequency may be N times the reference frequency $F_{ref}$, where N is a positive number. The filter 660/760 may generate a control signal $V_{ctrl}$ for adjusting the capacitance of the variable capacitor 324 according to a comparison result of the oscillating frequency of the LC tank and the reference frequency $F_{ref}$. The filter 660/760 may comprise a lock detector 680/780. When the lock detector 680/780 detects that a phase of the oscillating signal after being frequency divided is aligned with a phase of the reference frequency $F_{ref}$ (that is, the phase of the oscillating signal after being frequency divided is locked to the phase of the reference frequency $F_{ref}$), the lock detector 680/780 generates an enable signal EN, meaning that the calibration of the reception frequency is completed, to the micro-processor 130 or the corresponding control hardware circuit. Then, the frequency and bandwidth calibration procedure goes into the state S3.

Referring back to FIG. 5 and FIG. 6, as discussed above, in the state S3, the micro-processor 130 or the corresponding hardware control circuit sets the control voltage DN of the accumulator 630 to a high voltage level (for example, DN=1), for controlling the accumulator to perform a counting-down operation. The accumulated value output by the accumulator may be converted into the corresponding control voltage or control current, for adjusting the transconductance of the negative resistance device 223 and making the amplifier circuit 222 leave the self-oscillating mode and enter or return to the amplifying mode.

According to an embodiment of the invention, the reception bandwidth of the wake-up receiver 120/220 is adjusted while the circuit sub-unit 641 of the calibration circuit adjusts the transconductance of the negative resistance device 323. When the amplifier circuit 322 leaves the self-oscillating mode, the accumulator 630 stops the counting-down operation, so as to stop adjusting the transconductance of the negative resistance device 323. Meanwhile, the LC tank stop oscillating and the frequency and bandwidth calibration procedure goes back to the state S0. In this manner, since the transconductance of the negative resistance device 323 is adjusted to the oscillation threshold (that is, a threshold or a boundary value at which the LC tank is switched from oscillating to not oscillating) or to a value approaches the oscillation threshold, the reception bandwidth of the amplifier circuit 322 may be adjusted to the narrowest bandwidth that the self-oscillation will not occur.

According to an embodiment of the invention, in the state S3, an absolute value of the transconductance of the negative resistance device is increased in response to the control voltage $V_b$ or the control current $I_{DAC}$, so as to mitigate the negative resistive characteristic of the negative resistance device and make the amplifier circuit leave the self-oscillating mode and enter the amplifying mode. For example, the resistance adjusting circuit 426 decreases the amount of control current $I_{DAC}$ by increasing the bias voltage $V_{BIAS}$ or adjusting the amount of conducted current, so as to accordingly increase the absolute value of the transconductance and mitigate the negative resistive characteristic of the negative resistance device, and the amplifier circuit can leave the self-oscillating mode and enter the amplifying mode.

Via the bandwidth adjustment as discussed above, the wake-up receiver 120/220 can maintain the narrow band operation, so as to increase the receiving sensitivity. According an embodiment of the invention, the reception bandwidth of the wake-up receiver 120/220 can be well-controlled to be less than 1 MHz.

Figure 13:
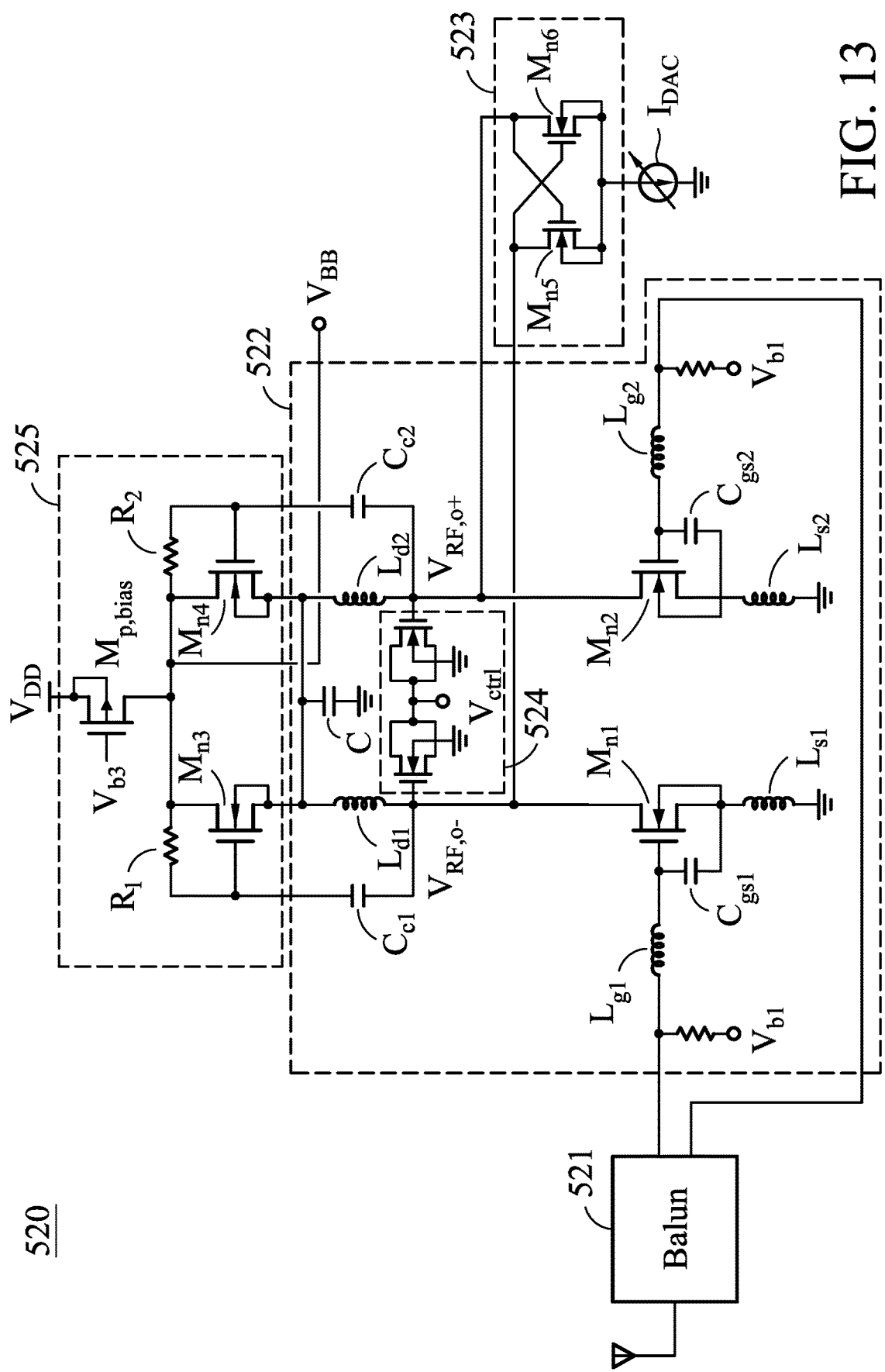
FIG. 13 shows an exemplary circuit diagram of a wake-up receiver according to an embodiment of the invention.

FIG. 13 shows an exemplary circuit diagram of a wake-up receiver according to an embodiment of the invention. The wake-up receiver 520 may comprise a balance-unbalance transformer (Balun) 521, an amplifier circuit 522, a negative resistance device 523, a variable capacitor 524 and an envelope detector 525. The amplifier circuit 522 is coupled to the bias voltage $V_{b1}$ and comprises transistors $M_{n1}$ and $M_{n2}$, the inductor $L_{d1}$, $L_{d2}$, $L_{g1}$, $L_{g2}$, $L_{s1}$ and $L_{s2}$, and the capacitors C, $C_{c1}$, $C_{c2}$, $C_{gs1}$, $C_{gs2}$. The negative resistance device 523 is coupled to the control current $I_{DAC}$ and comprises transistors $M_{n5}$ and $M_{n6}$. The variable capacitor 524 is coupled to the control signal (voltage) $V_{ctrl}$ and comprises a pair of transistors. The envelop detector 525 is coupled to the bias voltage $V_{b3}$ and comprises transistors $M_{p,bias}$, $M_{n3}$ and $M_{n4}$ and resistors $R_1$ and $R_2$.

Note that the wake-up receiver 520 shown in FIG. 13 is only one of a various implementation circuits of the invention, and the invention is not limited to this implementation circuit.

Figure 14A:
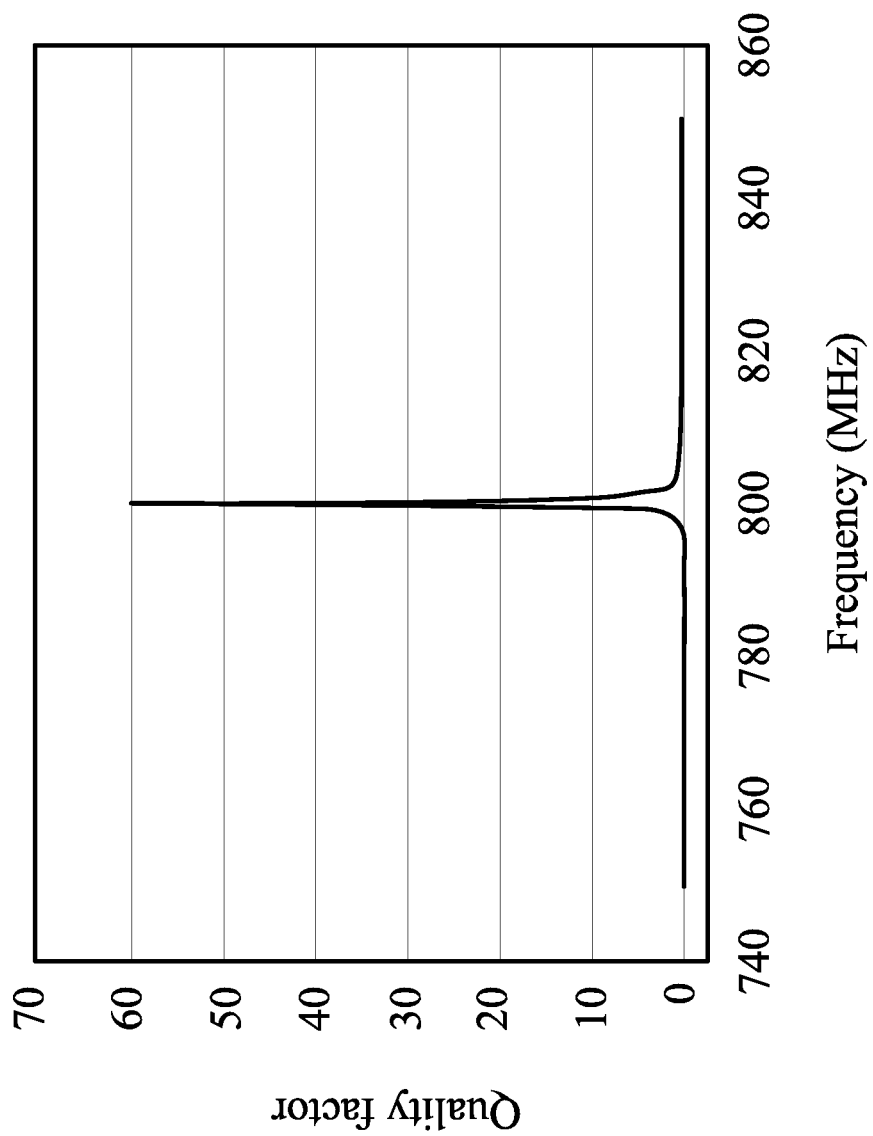
FIG. 14A is a schematic diagram showing the quality factor of the wake-up receiver with the negative resistance device according to an embodiment of the invention.
Figure 14B:
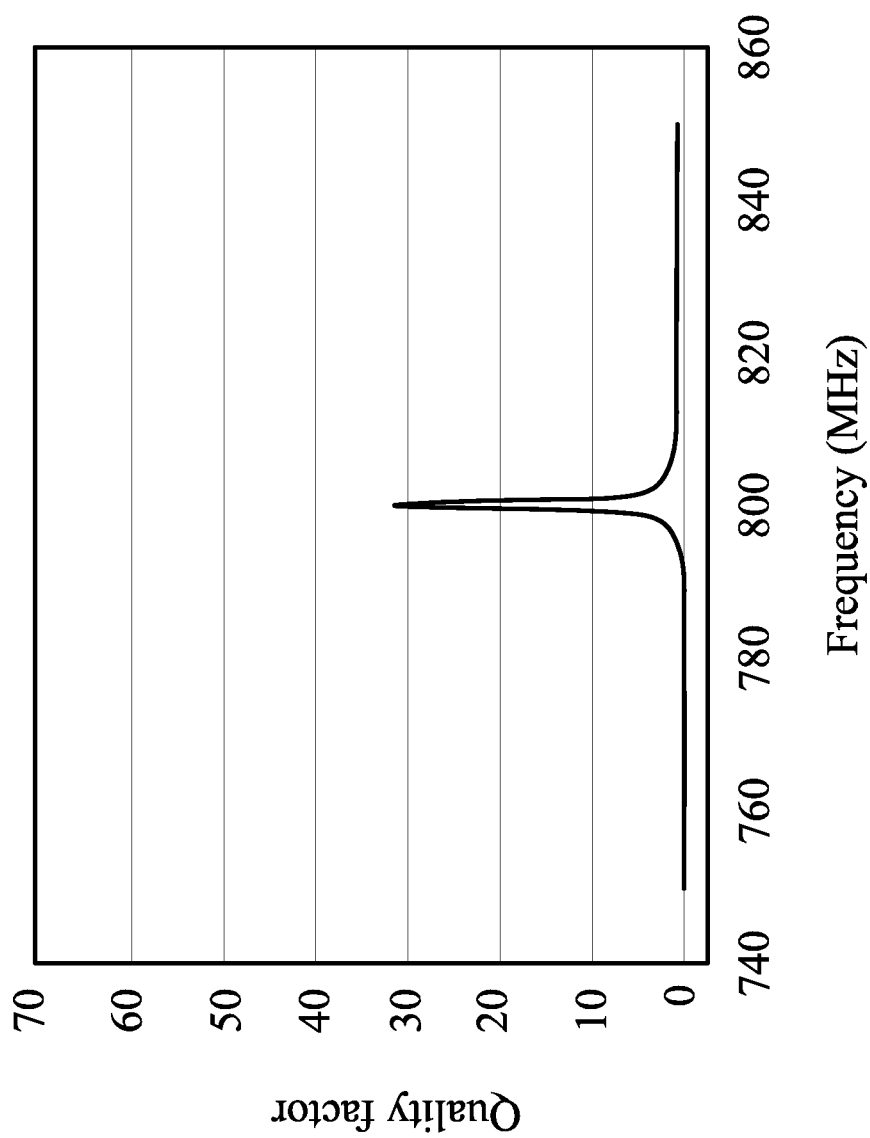
FIG. 14B is a schematic diagram showing the quality factor of the wake-up receiver without the negative resistance device.

FIG. 14A is a schematic diagram showing the quality factor of the wake-up receiver with the negative resistance device according to an embodiment of the invention. FIG. 14B is a schematic diagram showing the quality factor of the wake-up receiver without the negative resistance device. The quality factor is obtained by dividing the central frequency by the bandwidth. As shown in the figures, when the negative resistance device is used for bandwidth calibration, the quality factor can be increased from 30 to 60.

Figure 15:
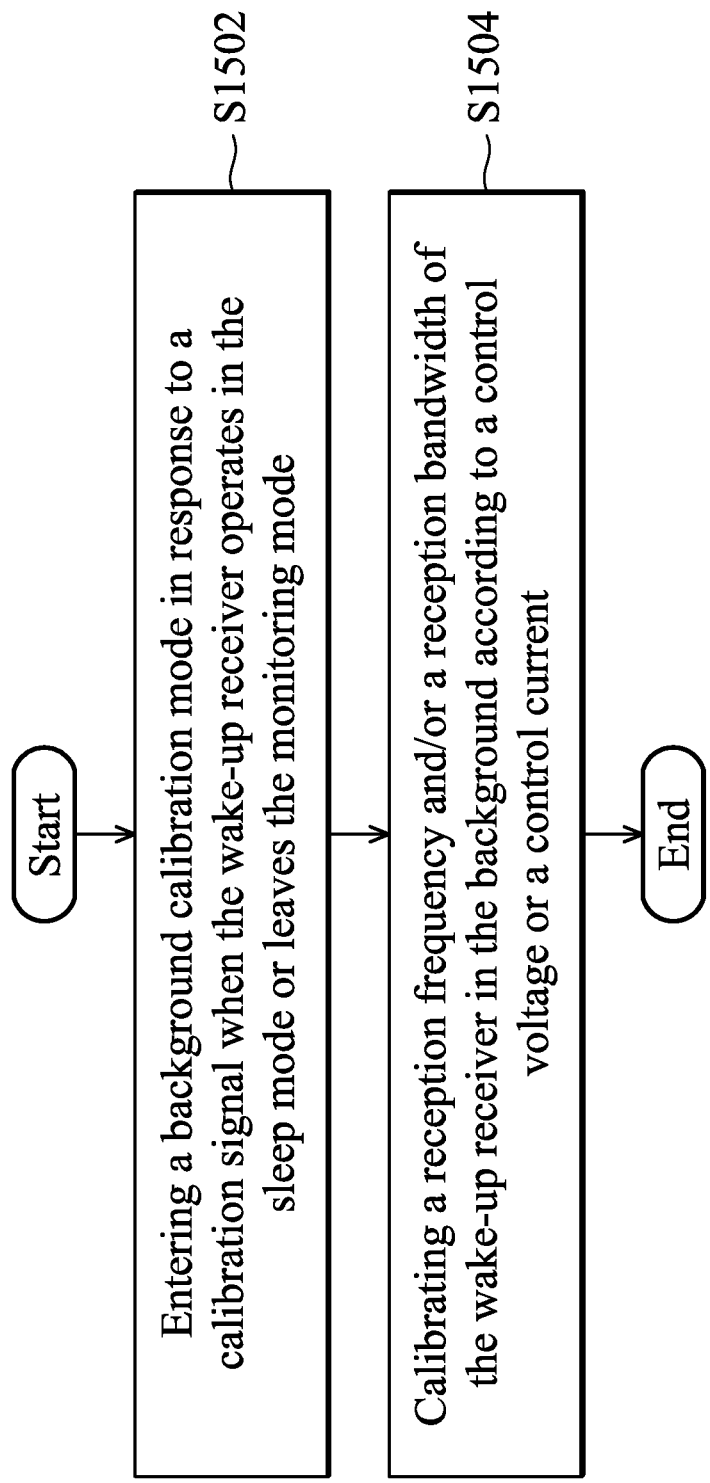
FIG. 15 is a flow chart of a method for calibrating a frequency and a bandwidth according to an embodiment of the invention.

FIG. 15 is a flow chart of a method for calibrating a frequency and a bandwidth according to an embodiment of the invention. According to an embodiment of the invention, the proposed method for calibrating a frequency and a bandwidth is suitable for a wireless receiving device comprising a wake-up receiver, a main receiver and a calibration circuit, wherein the wake-up receiver operates in a monitoring mode or a sleep mode, and comprises an amplifier circuit. When the wake-up receiver operates in the monitoring mode, the wake-up receiver monitors a request signal in a wireless communication environment and issues a wake-up signal to wake up the main receiver after receiving the request signal. The proposed method comprises: entering a background calibration mode in response to a calibration signal when the wake-up receiver operates in the sleep mode or leaves the monitoring mode (Step S1502); and in the background calibration mode, calibrating a reception frequency and/or a reception bandwidth of the wake-up receiver in the background according to a control voltage or a control current (Step S1504).

Figure 16:
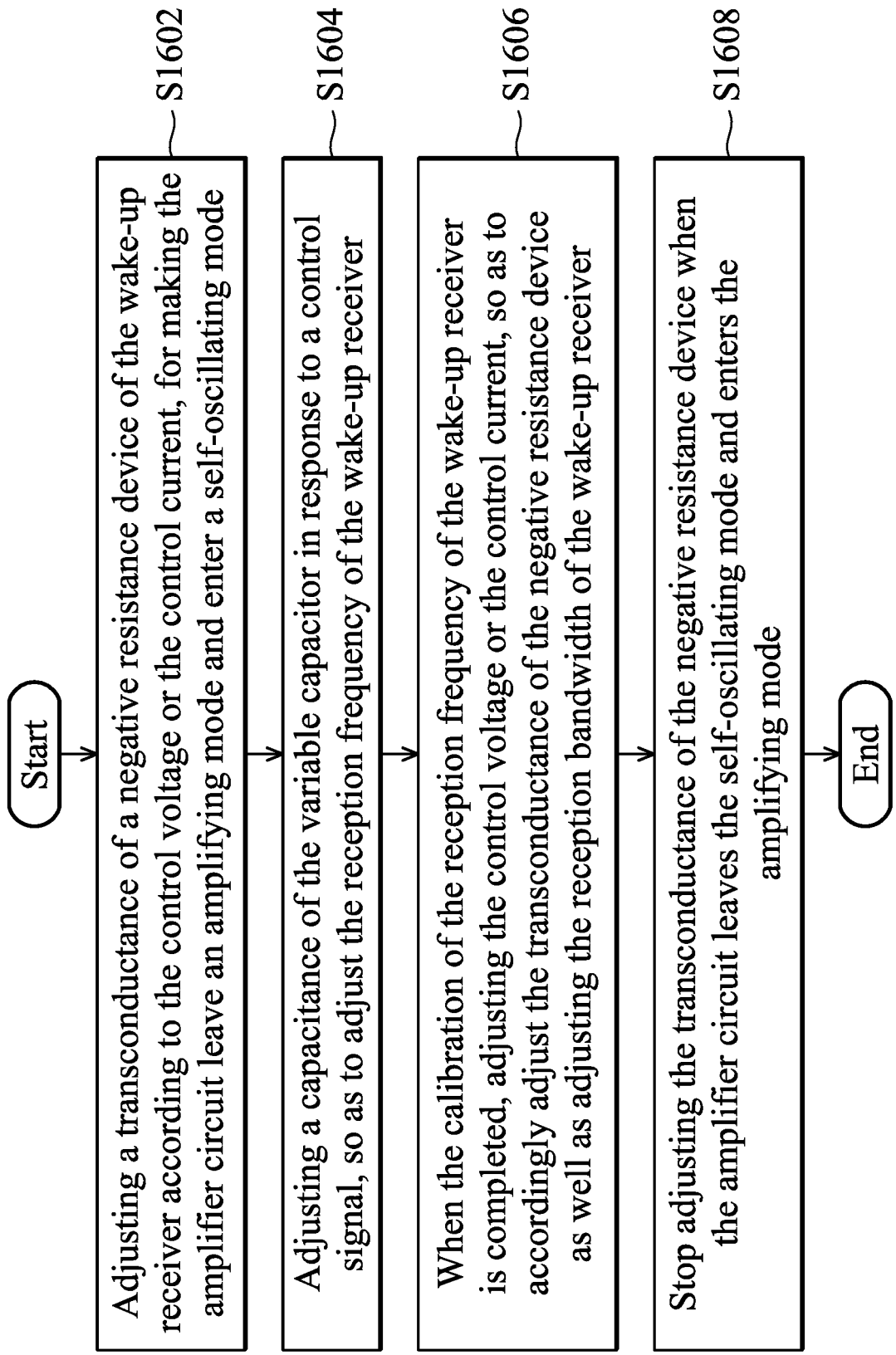
FIG. 16 is another flow chart of a method for calibrating a frequency and a bandwidth according to an embodiment of the invention.

FIG. 16 is another flow chart of a method for calibrating a frequency and a bandwidth according to an embodiment of the invention. In an embodiment of the invention, the step S1504 shown in FIG. 15 may further comprise: adjusting a transconductance of a negative resistance device of the wake-up receiver according to the control voltage or the control current, for making the amplifier circuit leave an amplifying mode and enter a self-oscillating mode (Step S1602); adjusting a capacitance of the variable capacitor in response to a control signal (voltage), so as to adjust the reception frequency of the wake-up receiver (Step S1604); when the calibration of the reception frequency of the wake-up receiver is completed, adjusting the control voltage or the control current so as to accordingly adjust the transconductance of the negative resistance device, and thus the reception bandwidth of the wake-up receiver can be adjusted (Step S1606); finally, when the amplifier circuit leaves the self-oscillating mode and enters the amplifying mode, stop adjusting the transconductance of the negative resistance device (Step S1608).

In the embodiments of the invention, the computation and logic control abilities of the micro-processor in the main circuit and related circuits are used to assist the performance of frequency and bandwidth calibration of the wake-up receiver, so as to obtain both accurate and efficient calibration results. In addition, the wireless receiving circuit structure and the corresponding frequency and bandwidth calibration technology of the wireless receiving device provided by the invention not only allow the wake-up receiver to maintain the narrow bandwidth (for example, less than 1 MHz) operation by adjusting the bandwidth, so as to increase the receiving sensitivity, but also include tunable frequency designs (including tunable bandwidth and frequency), so as to increase the design flexibility of the wake-up receiver, and make the wireless receiving device circuit widely applicable in a variety of wireless communication systems.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A wireless receiving device, comprising:
a wake-up receiver, operating in a monitoring mode or a sleep mode, when operating in the monitoring mode, the wake-up receiver monitors whether a request signal is transmitted by a communication device and issues a wake-up signal after receiving the request signal;
a main receiver, operating in a sleep mode or a transmission mode, when operating in the sleep mode, the main receiver is woken up and enters the transmission mode when receiving the wake-up signal to transmit and receive data to and from the communication device; and
a calibration circuit, coupled to the wake-up receiver and the main receiver and configured to receive a calibration signal from the main receiver and calibrate a reception frequency of the wake-up receiver in the background in response to the calibration signal;
wherein the wake-up receiver comprises:
an amplifier circuit, operating in an amplifying mode or a self-oscillating mode, when the wake-up receiver operates in the monitoring mode, the amplifier circuit operates in the amplifying mode and is configured to receive a pair of input signals and amplify the pair of input signals to generate a pair of output signals;

a negative resistance device; and a variable capacitor, wherein the negative resistance device and the variable capacitor are coupled to the amplifier circuit and act as a loading circuit of the amplifier circuit, wherein the calibration circuit generates a control voltage or a control current to adjust a transconductance of the negative resistance device and to make the amplifier circuit leave the amplifying mode and enter the self-oscillating mode, and the calibration circuit stops adjusting the transconductance of the negative resistance device after the amplifier circuit has entered the self-oscillating mode.

2. The wireless receiving device as claimed in claim 1, wherein when the amplifier circuit operates in the self-oscillating mode, the calibration circuit further outputs a control signal for adjusting capacitance of the variable capacitor, so as to adjust the reception frequency of the wake-up receiver.

3. The wireless receiving device as claimed in claim 1, wherein when the calibration of the reception frequency of the wake-up receiver is completed, the calibration circuit further adjusts the control voltage or the control current so as to accordingly adjust the transconductance of the negative resistance device and to make the amplifier circuit leave the self-oscillating mode and enter the amplifying mode, and the calibration circuit stops adjusting the transconductance of the negative resistance device after the amplifier circuit has entered the amplifying mode.

4. The wireless receiving device as claimed in claim 3, wherein a reception bandwidth of the wake-up receiver is adjusted while the calibration circuit adjusts the transconductance of the negative resistance device.

5. The wireless receiving device as claimed in claim 1, wherein the calibration circuit determines whether to adjust the transconductance of the negative resistance device according to a comparison result of the pair of output signals with a predetermined voltage threshold.

6. A wake-up receiver, comprising:

an amplifier circuit, operating in an amplifying mode or a self-oscillating mode, wherein when the amplifier circuit operates in the amplifying mode, the amplifier circuit is configured to receive a pair of input signals and amplify the pair of input signals to generate a pair of output signals;

a negative resistance device; and a variable capacitor, wherein the negative resistance device and the variable capacitor are coupled to the amplifier circuit and act as a loading circuit of the amplifier circuit, wherein in a background calibration mode of the wake-up receiver, a transconductance of the negative resistance device is adjusted in response to a control voltage or a control current, for making the amplifier circuit leave the amplifying mode and enter the self-oscillating mode, so as to calibrate a reception frequency of the wake-up receiver.

7. The wake-up receiver as claimed in claim 6, wherein when the amplifier circuit operates in the self-oscillating mode, capacitance of the variable capacitor is adjusted in response to a control signal, so as to adjust the reception frequency of the wake-up receiver.

8. The wake-up receiver as claimed in claim 6, wherein when the calibration of the reception frequency of the wake-up receiver is completed, the transconductance of the negative resistance device is further adjusted in response to the control voltage or the control current, so as to calibrate a reception bandwidth of the wake-up receiver.

9. The wake-up receiver as claimed in claim 6, wherein when the amplifier circuit leaves the self-oscillating mode and enters the amplifying mode, the transconductance of the negative resistance device is not adjusted.

10. A method for calibrating a frequency and a bandwidth, suitable for a wireless receiving device comprising a wake-up receiver, a main receiver and a calibration circuit, wherein the wake-up receiver operates in a monitoring mode or a sleep mode, and comprises an amplifier circuit, and when the wake-up receiver operates in the monitoring mode, the wake-up receiver monitors a request signal in a wireless communication environment and issues a wake-up signal after receiving the request signal to wake up the main receiver, the method comprising:

when the wake-up receiver operates in the sleep mode or leaves the monitoring mode, entering a background calibration mode in response to a calibration signal; and in the background calibration mode, calibrating a reception frequency and/or a reception bandwidth of the wake-up receiver in the background according to a control voltage or a control current;

wherein the step of calibrating a reception frequency and/or a reception bandwidth of the wake-up receiver in the background according to a control voltage or a control current in the background calibration mode further comprises:

adjusting a transconductance of a negative resistance device of the wake-up receiver according to the control voltage or the control current, for making the amplifier circuit leave an amplifying mode and enter a self-oscillating mode;

adjusting capacitance of the variable capacitor in response to a control signal, so as to adjust the reception frequency of the wake-up receiver.

11. The method as claimed in claim 10, further comprising:

when the calibration of the reception frequency of the wake-up receiver is completed, adjusting the control voltage or the control current so as to accordingly adjust the transconductance of the negative resistance device, for adjusting the reception bandwidth of the wake-up receiver; and when the amplifier circuit leaves the self-oscillating mode and enters the amplifying mode, stop adjusting the transconductance of the negative resistance device.

12. The method as claimed in claim 11, wherein an absolute value of the transconductance of the negative resistance device is increased in response to the control voltage or the control current, so as to make the amplifier circuit leave the self-oscillating mode and enter the amplifying mode.

13. The method as claimed in claim 10, wherein an absolute value of the transconductance of the negative resistance device is decreased in response to the control voltage or the control current, so as to make the amplifier circuit leave the amplifying mode and enter the self-oscillating mode.

* * * * *